(12) United States Patent
Kuhara et al.

(10) Patent No.: US 7,067,854 B2
(45) Date of Patent: Jun. 27, 2006

(54) OPTICAL RECEIVER

(75) Inventors: Yoshiki Kuhara, Suita (JP); Mitsuaki Nishie, Yokohama (JP); Shigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 87 days.

(21) Appl. No.: 10/940,547

(22) Filed: Sep. 14, 2004

(65) Prior Publication Data

US 2005/0104086 A1     May 19, 2005

(30) Foreign Application Priority Data

Sep. 16, 2003   (JP)   ............... 2003-323481

(51) Int. Cl.
*H01L 31/0328* (2006.01)
(52) U.S. Cl. ...................... 257/186; 257/433
(58) Field of Classification Search .............. 257/186, 257/432, 433, 438, 656, 724
See application file for complete search history.

(56) References Cited

U.S. PATENT DOCUMENTS

2005/0104086 A1 * 5/2005 Kuhara et al. ............. 257/186

FOREIGN PATENT DOCUMENTS

| JP | 63077171 | 4/1988 |
|---|---|---|
| JP | 63105541 | 5/1988 |

* cited by examiner

*Primary Examiner*—Mark V. Prenty
(74) *Attorney, Agent, or Firm*—Fish & Richardson P.C.

(57) ABSTRACT

An optical receiver includes an avalanche photodiode (APD) having a light-receiving area provided on a face of a first substrate, the light-receiving area receiving a part of signal light; a photodetector having a light-receiving area provided on a face of a second substrate, the light-receiving area receiving the other part of the signal light; and a mounting member having a principal plane on which the APD and the photodetector are mounted. Due to this structure, crosstalk between the APD and the photodetector does not occur and an avalanche multiplication factor of the APD can be controlled on the basis of the output current of the photodetector.

12 Claims, 16 Drawing Sheets

Position on light-receiving surface

Position on light-receiving surface

Position on light-receiving surface

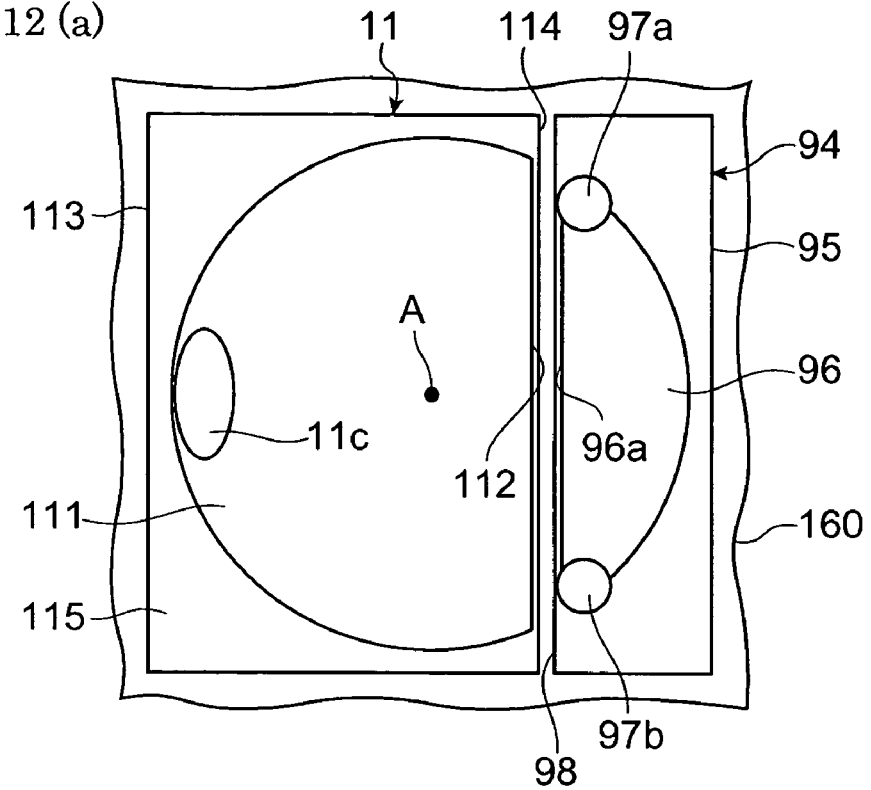
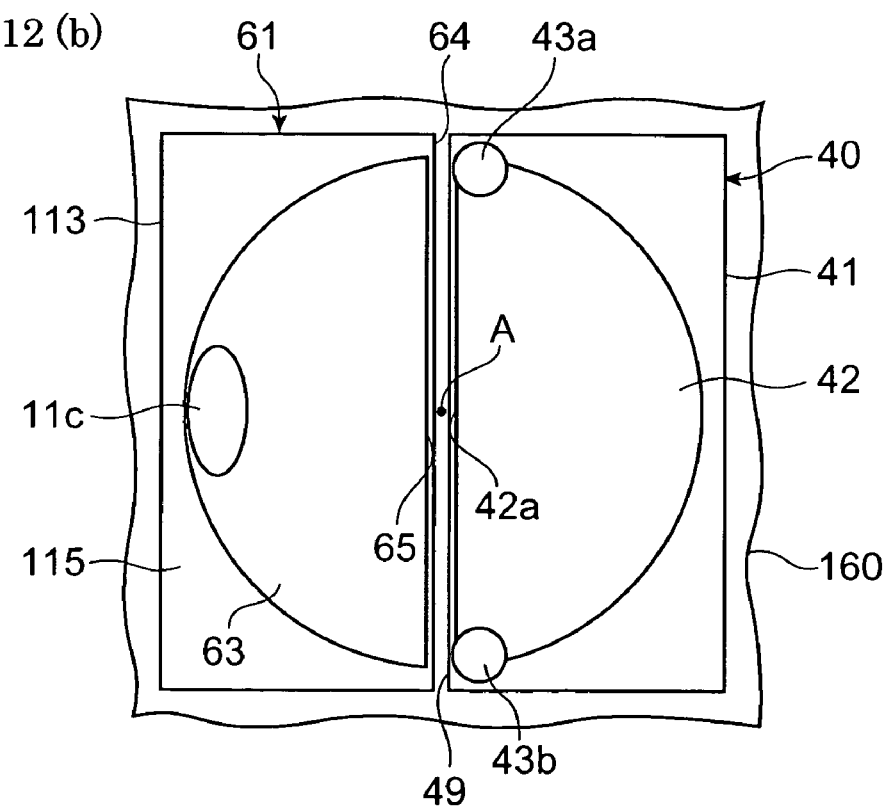

FIG.16 (a) PRIOR ART
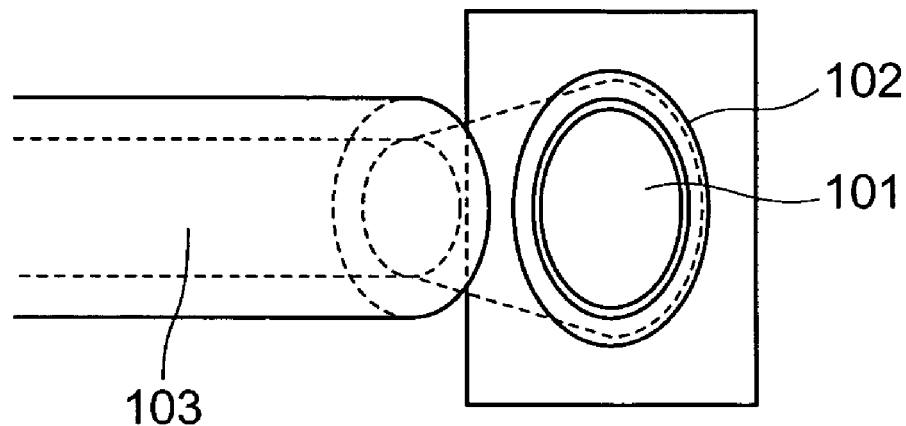
FIG.16 (b) PRIOR ART
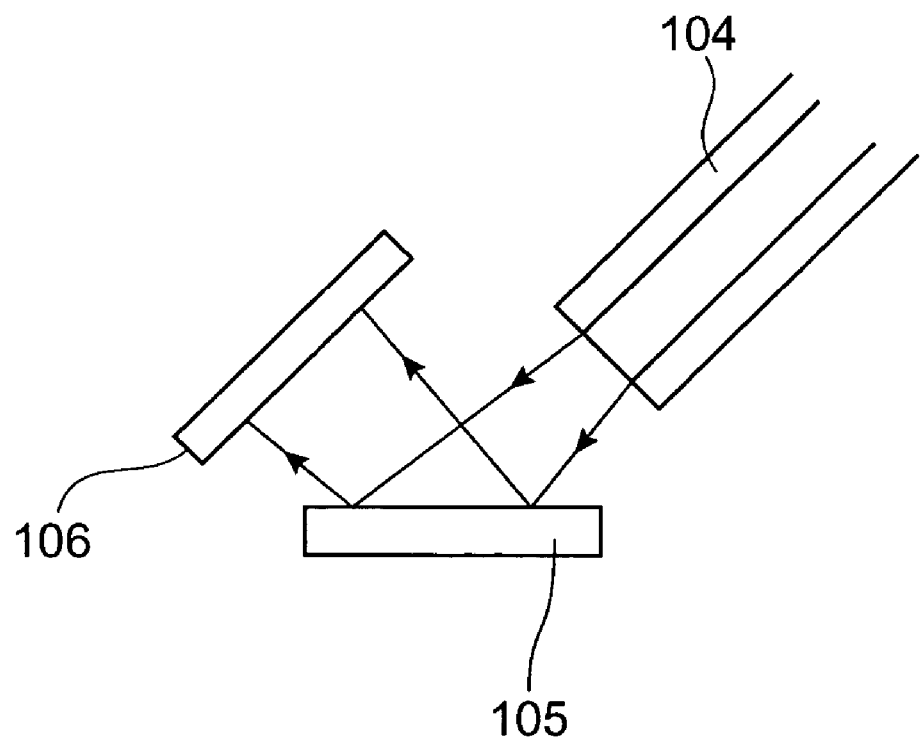

OPTICAL RECEIVER

BACKGROUND OF THE INVENTION

1. Field of the Invention

The present invention relates to an optical receiver which detects signal light with an avalanche photodiode.

2. Description of the Background Art

In an optical communication system, an optical receiver employing an avalanche photodiode (hereafter abbreviated as APD) as a photodetector is used conventionally. APDs have a function to amplify signal photocurrents and are suitable for use as photodetectors in optical fiber communication systems using weak optical signals.

A typical characteristic of an APD is that the avalanche multiplication factor thereof varies due to temperature variation or the like. This is due to a relatively high reverse bias voltage applied to the APD when avalanche multiplication is performed. More specifically, the APD is operated at a voltage close to a break-down voltage of a PN junction, and therefore the operating characteristics of the APD are extremely sensitive to variation in ambient temperature or the like. Accordingly, the avalanche multiplication factor of the APD is preferably controlled such that a constant multiplication factor can be obtained even when temperature variation or the like occurs.

Japanese Unexamined Patent Application Publication No. 63-77171 discloses an optical receiver having a structure for controlling a multiplication factor of an APD. The structure of this optical receiver is shown in FIG. 16(a). This optical receiver has an optical-signal-receiving area 101 and an optical-signal-monitoring area 102 on a common substrate, and receives signal light from an optical fiber 103 at these areas. An avalanche photodiode is provided in the optical-signal-receiving area 101, and a multiplication factor at the optical-signal-receiving area 101 is controlled on the basis of an output current value obtained at the optical-signal-monitoring area 102.

In addition, Japanese Unexamined Patent Application Publication No. 63-105541 discloses another optical receiver having a different structure for controlling a multiplication factor of an APD. The structure of this optical receiver is shown in FIG. 16(b). This optical receiver includes an APD 105 and a photodiode 106. The APD 105 receives signal light emitted from an optical fiber 104, and the photodiode 106 receives signal light reflected by a light-receiving area of the APD 105. The multiplication factor of the APD 105 is controlled on the basis of an output current value obtained by the photodiode 106.

In the optical receiver disclosed in Japanese Unexamined Patent Application Publication No. 63-77171, the optical-signal-receiving area 101 and the optical-signal-monitoring area 102 are formed on the same plane of the same substrate. Therefore, there is a large possibility that crosstalk will occur between the optical-signal-receiving area 101 and the optical-signal-monitoring area 102. When the crosstalk occurs, the accuracy of detection of the signal light at the optical-signal-monitoring area 102 is reduced and it is therefore difficult to control the multiplication factor at the optical-signal-receiving area 101 with high accuracy.

In the optical receiver disclosed in Japanese Unexamined Patent Application Publication No. 63-105541, the signal light is incident on the APD 105 inevitably at an angle. However, when the signal light is incident on the light-receiving area of the APD 105 at an angle, the reflectance of the signal light varies depending on the polarization state of the signal light. Although the dependency on the polarization state can be eliminated by forming a multilayer film, it is difficult to form the multilayer film on the light-receiving area of the APD 105, which is a semiconductor device. Therefore, in this optical receiver, the quantity of the signal light incident on the photodiode 106 varies depending on the polarization state of the signal light emitted from the optical fiber 104, and it is difficult to control the avalanche multiplication factor of the APD 105 with high accuracy.

SUMMARY OF THE INVENTION

In view of the above-described problem, an object of the present invention is to provide an optical receiver in which an avalanche multiplication factor of an APD can be accurately controlled.

In order to attain the above-described object, according to one embodiment of the present invention, an optical receiver for receiving signal light includes an avalanche photodiode having a light-receiving area provided on a face of a first substrate, the light-receiving area receiving a part of the signal light; a photodetector having a light-receiving area provided on a face of a second substrate, the light-receiving area receiving the other part of the signal light; and a mounting member having a principal plane on which the avalanche photodiode and the photodetector are mounted. The avalanche photodiode and the photodetector are arranged adjacent to each other on the mounting member such that the rear face of the first substrate and the rear face of the second substrate both face the principal plane of the mounting member.

In the above-described optical receiver, the APD and the photodetector are formed on different substrates (first and second substrates, respectively). Consequently, crosstalk between the APD and the photodetector can be prevented. In the above-described optical receiver, signal light can be incident, at the same time along the same optical axis, on the light-receiving areas of the APD and the photodetector which are disposed side by side on a mounting member. Therefore, the reflection of signal light is unnecessary or a reflecting member provided with a multilayer film can easily be used. Therefore, it is possible to structure such that signal light is incident on the light-receiving areas of the APD and the photodetector without the quantity of the signal light being varied depending on the polarization state of the signal light. Thus, in the above-described optical receiver, the avalanche multiplication factor of the APD can accurately be controlled on the basis of the output current of the photodetector.

In the optical receiver, the photodetector may be a PIN photodiode or a photoconductive element. With these elements whose output current value is substantially linear with respect to the quantity of received light, the avalanche multiplication factor of the APD can easily be controlled.

The optical receiver may be structured such that a side of the light-receiving area of the avalanche photodiode and a side of the light-receiving area of the photodetector extend facing each other in parallel. Thus, it is possible to reduce a region, at which the signal light is not received, existing between the light-receiving area of the APD and the light-receiving area of the photodetector. Accordingly, the APD and the photodetector can efficiently receive signal light, respectively.

The optical receiver may be structured such that the photodetector is disposed in a form surrounding the avalanche photodiode. Accordingly, it is easy to make a structure in which the APD receives a part of the signal light and the photodetector receives the other part of the signal light.

In addition, in the optical receiver, a position corresponding to a peak in a quantity profile of the signal light may be in the light-receiving area of the avalanche photodiode. The photodetector is used simply to control the avalanche multiplication factor of the APD, and the quantity of light required by the photodetector is lower than that required by the APD. In this optical receiver, light corresponding to the central area of the signal-light profile is received by the APD and light corresponding to a part or all of the peripheral area of the signal-light profile is received by the photodetector. Accordingly, the signal light can suitably be shared between the APD and the photodetector.

The optical receiver may be structured such that the mounting member has an inclined surface for reflecting signal light, the inclined surface adjoining the principal plane of the mounting member and extending in a direction intersecting an optical axis of an optical transmission medium which propagates the signal light, and the avalanche photodiode and the photodetector are mounted on the principal plane such that the avalanche photodiode and the photodetector project above the inclined surface, and the first substrate and the second substrate comprise a material which can transmit the signal light. In addition, the rear face of the first substrate and the rear face of the second substrate are optically coupled to one end of the optical transmission medium via the reflective surface. Accordingly, a suitable structure in which the APD and the photodetector are placed adjacent to each other on the mounting member and the light-receiving areas of the APD and the photodetector receive different parts of the signal light is obtained.

Preferably, the optical receiver further includes a lead frame on which the mounting member is placed, and the mounting member and the lead frame are covered with a molded resin.

In addition, preferably, the optical receiver further includes a package for accommodating the avalanche photodiode and the photodetector, the package including a lens for converging the signal light so as to direct the signal light to the avalanche photodiode and the photodetector.

The optical receiver may further include a control means for controlling, on the basis of an output current value obtained from the photodetector, either one or both of a current flowing through the avalanche photodiode and a supply voltage applied to the avalanche photodiode, such that an avalanche multiplication factor of the avalanche photodiode is maintained at a predetermined value. With such structure, the avalanche multiplication factor of the APD can be suitably controlled.

In this optical receiver, the control means may control either one or both of the supply voltage applied to the avalanche photodiode and the current flowing through the avalanche photodiode such that an average output current value obtained from the avalanche photodiode when the signal light is incident approaches the value of $m \cdot Ipin_1 \cdot (Iava_2/Ipin_2)$, where $Iava_2$ is an output current value in a PIN mode of the avalanche photodiode at a time when a quantity of light is incident and $Ipin_2$ is an output current value of the photodetector at that time, m is a desired avalanche multiplication factor, and $Ipin1$ is the value of an output current from the photodetector. Accordingly, the desired avalanche multiplication factor can be obtained with high accuracy.

The control means of the optical receiver may be provided with a converting circuit for converting the output current value obtained from the photodetector into a voltage signal; a current mirror circuit having an input, a first output, and a second output and being structured such that the amount of current at the second output is substantially equal to the amount of current at the first output, and the first output being connected to the avalanche photodiode; a power supply circuit for supplying the supply voltage to the input of the current mirror circuit; and a voltage control circuit for controlling the supply voltage on the basis of the voltage signal obtained from the converting circuit and the amount of current at the second output of the current mirror circuit. In this optical receiver, the supply voltage applied to the APD is controlled on the basis of the amount of current at the second output using the fact that the amount of current at the second output of the current mirror circuit is substantially equal to the amount of current supplied to the APD from the first output of the current mirror circuit. Accordingly, the avalanche multiplication factor of the APD can be more suitably controlled.

Alternatively, in the optical receiver, the control means may include a converting circuit for converting the output current value obtained from the photodetector into a voltage signal; a current mirror circuit having an input, a first output, and a second output, the amount of current at the second output being substantially equal to the amount of current at the first output and the second output being connected to the avalanche photodiode; a power supply circuit for supplying the supply voltage to the input of the current mirror circuit; and a current control circuit for controlling the amount of current at the first output of the current mirror circuit on the basis of the voltage signal obtained from the converting circuit. In this optical receiver, the amount of current supplied to the APD from the second output is controlled by controlling the amount of current at the first output using the fact that the amount of current at the second output of the current mirror circuit is substantially equal to the amount of current supplied to the APD from the first output of the current mirror circuit. Accordingly, the avalanche multiplication factor of the APD can be more suitably controlled.

As described above, in the optical receiver of the present invention, the avalanche multiplication factor of the APD can be suitably controlled on the basis of the output current of the photodetector.

BRIEF DESCRIPTION OF THE DRAWINGS

FIG. 12(a) is a plan view showing an APD and a photoconductive element of an optical receiver according to a sixth modification of the embodiment, and FIG. 12(b) is a plan view showing an APD and a photoconductive element of an optical receiver according to a seventh modification of the embodiment;

FIG. 16(a) is a diagram showing a structure provided for controlling a multiplication factor of an APD in a known optical receiver, and FIG. 16(B) is a diagram showing a structure provided for controlling a multiplication factor of an APD in another known optical receiver.

DETAILED DESCRIPTION OF THE INVENTION

Figure 1:
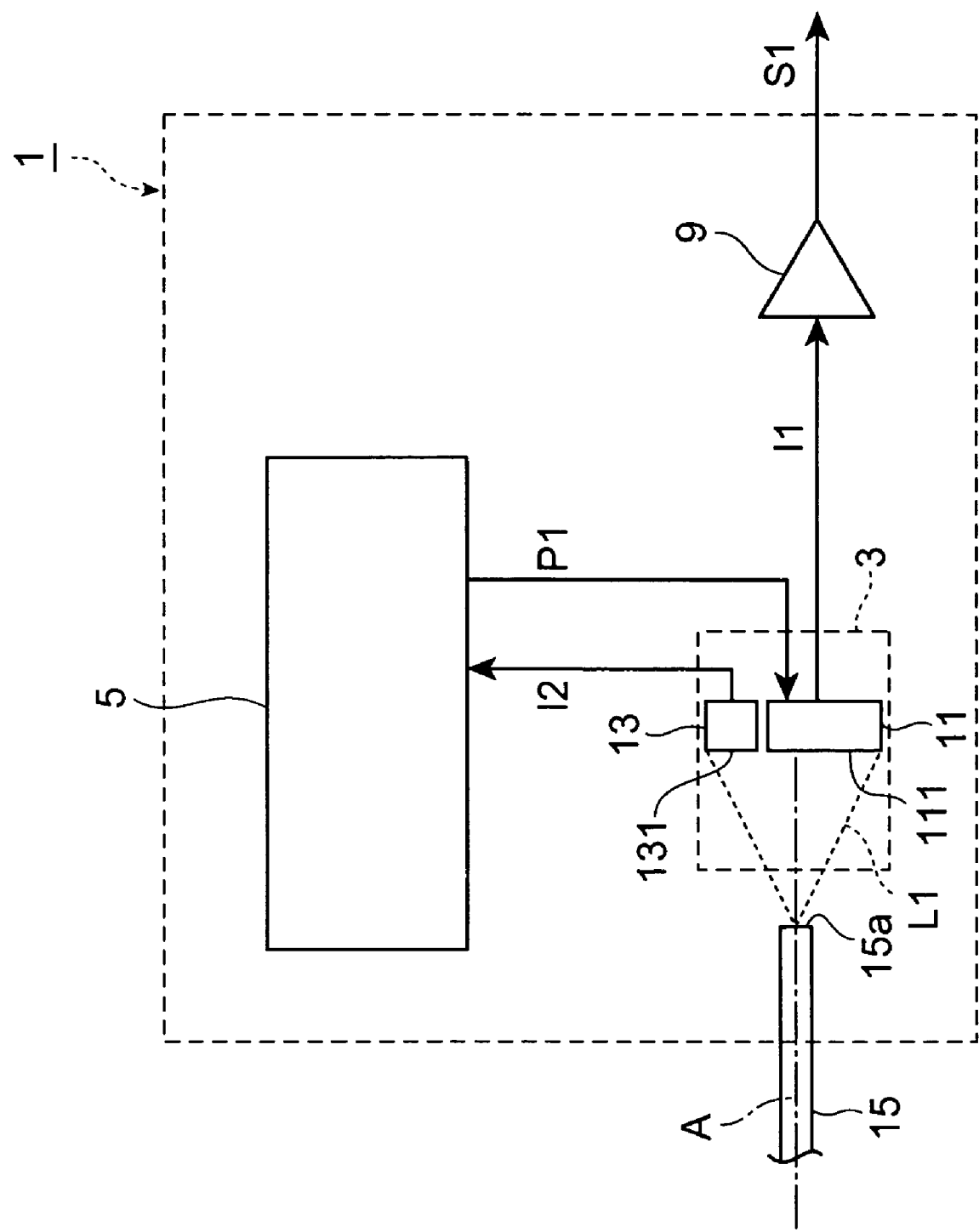
FIG. 1 is a block diagram showing an optical receiver according to an embodiment of the present invention.

Optical receivers according to embodiments of the present invention will be described below with reference to the accompanying drawings. In the figures, similar components are denoted by the same reference numerals and redundant explanations are thus omitted.

EMBODIMENT

FIG. 1 is a block diagram showing an optical receiver according to an embodiment of the present invention. With reference to FIG. 1, an optical receiver 1 according to the present embodiment includes a light-receiving part 3, a control part 5, an amplifier 9, and an optical fiber 15. The optical fiber 15 emits signal light L1, which has propagated through the optical fiber 15 from the outside of the optical receiver 1, toward the light-receiving part 3 from an end 15a of the optical fiber 15.

The light-receiving part 3 includes an APD 11 and a PIN photodiode (hereafter abbreviated as PIN-PD) 13. The APD 11 has a light-receiving area 111 which is optically coupled to the end 15a of the optical fiber 15. The PIN-PD 13 has a light-receiving area 131 which is also optically coupled to the end 15a of the optical fiber 15. The APD 11 and the PIN-PD 13 are mounted on a mounting member, which will be described later, such that the light-receiving area 111 and the light-receiving area 131 are adjacent to each other in a direction intersecting an optical axis A of the signal light L1. The light-receiving area 111 receives a part of the signal light L1 emitted from the end 15a of the optical fiber 15 along the optical axis A, for example, 90% to 99% of the signal light L1 in terms of quantity of light. The light-receiving area 131 receives the other part of the signal light L1 emitted from the end 15a of the optical fiber 15 along the optical axis A, for example, 1% to 10% of the signal light L1 in terms of quantity of light.

The APD 11 converts the signal light L1 received at the light-receiving area 111 into an output current I1. A cathodic electrode of the APD 11 is electrically connected to the control part 5, and an anodic electrode of the APD 11 is electrically connected to the amplifier 9. The APD 11 is activated when the cathodic electrode receives a supply voltage P1 from the control part 5, and generates the output current I1 corresponding to the quantity of received light when the signal light L1 is incident on the light-receiving area 111. At this time, in the APD 11, a photocurrent generated when the signal light L1 is incident is multiplied by a predetermined multiplication factor due to the avalanche multiplication function, and thus the output current I1 is generated. The APD 11 supplies the generated output current I1 to the amplifier 9 from the anodic electrode thereof. The amplifier 9 generates a received signal S1 by converting the output current I1 obtained from the APD 11 into a voltage signal and amplifying it, and supplies the received signal S1 to the outside of the optical receiver 1.

The PIN-PD 13 functions as a photodetector in the present embodiment, and converts the signal light L1 received at the light-receiving area 131 into an output current I2. The PIN-PD 13 is provided on a semiconductor substrate (second substrate) different from a semiconductor substrate (first substrate) on which the APD 11 is provided, and the two substrates are not in contact with each other. A cathodic electrode of the PIN-PD 13 is electrically connected to a predetermined power-supply terminal (not shown), and an anodic electrode of the PIN-PD 13 is electrically connected to the control part 5. The PIN-PD 13 generates the output current I2 corresponding to the quantity of received light when the signal light L1 is incident on the light-receiving area 131. The PIN-PD 13 supplies the generated output current I2 to the control part 5 from the anodic electrode thereof.

The control part 5, which is a control means according to the present embodiment of the invention, controls the supply voltage P1 applied to the APD 11 on the basis of the output current value of the PIN-PD 13 such that the avalanche multiplication factor of the APD 11 is maintained at a predetermined value. More specifically, the control part 5 detects the quantity of the signal light L1 incident on the PIN-PD 13 on the basis of the output current I2 obtained from the PIN-PD 13. The control part 5 generates, on the basis of the optical power of the signal light L1 incident on the PIN-PD 13, the supply voltage P1 to be applied to the APD 11 such that avalanche multiplication of the photocurrent generated in accordance with the quantity of the signal light L1 incident on the APD 11 is achieved by a predetermined multiplication factor. The control part 5 may be constituted by, for example, an electric circuit and an arithmetic unit including a central processing unit (CPU), etc.

Figure 2:
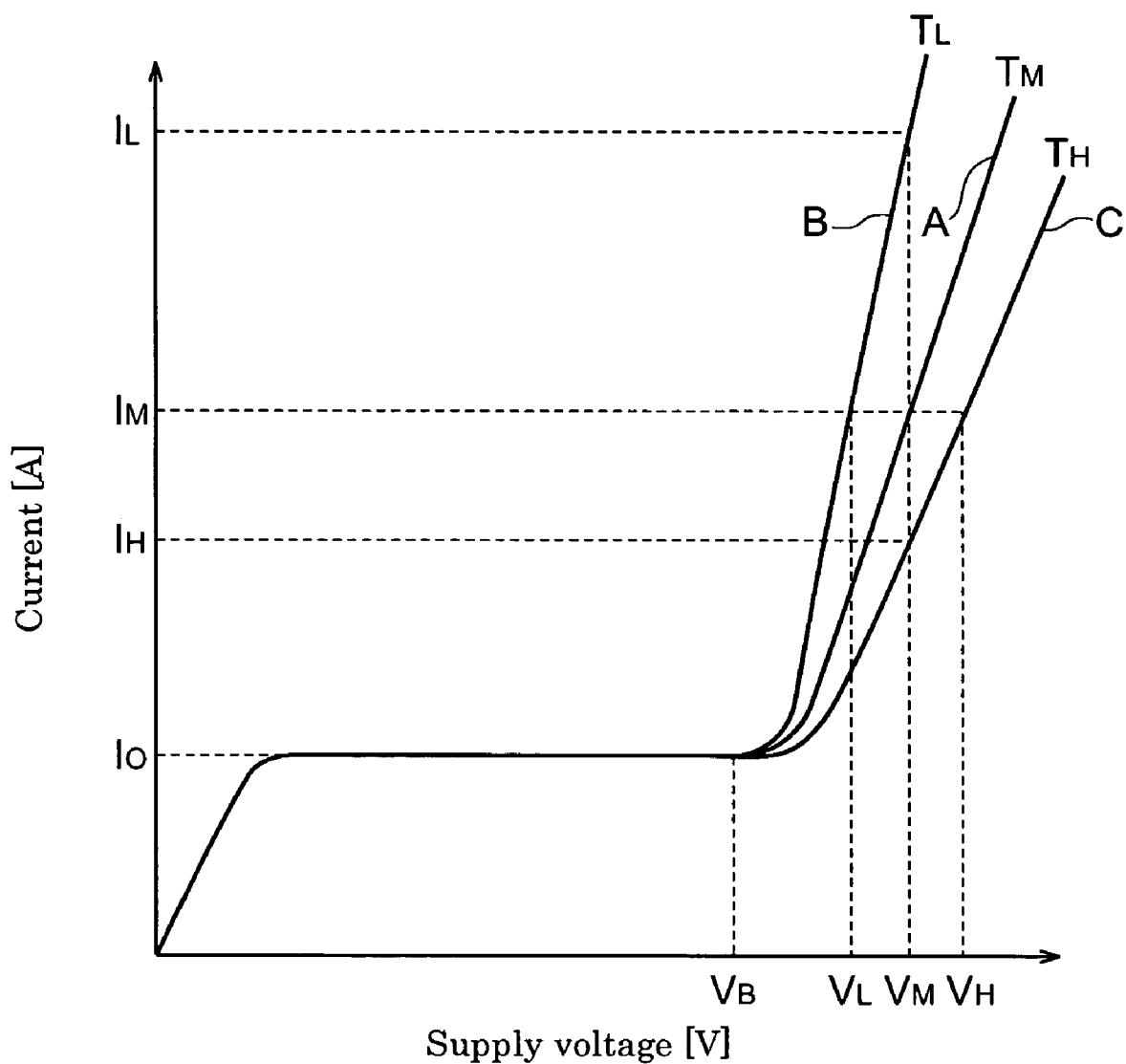
FIG. 2 is a graph showing the characteristics of output current of an APD versus a supply voltage applied thereto.

The above-described function of the control part 5 will be described in more detail below. FIG. 2 is a graph showing the characteristics of output current of an APD versus a supply voltage applied thereto. In the graph shown in FIG. 2, it is assumed that the quantity of light incident on the light-receiving area 111 of the APD 11 is constant. With reference to FIG. 2, the APD 11 generates a photocurrent $I_O$ corresponding to the quantity of the incident light when a supply voltage lower than a predetermined voltage $V_B$ is applied to the APD 11 (this state is called a PIN mode in the APD 11). When a supply voltage higher than the predetermined voltage $V_B$ is applied to the APD 11, the APD 11 performs the avalanche multiplication function and the output current value obtained from the APD 11 becomes equivalent to the product of the photocurrent $I_O$ and a predetermined multiplication factor.

The avalanche multiplication is caused by a supply voltage of relatively high reverse bias voltage being applied to the APD 11. At this time, the APD 11 works at a voltage close to a break-down voltage of a PN junction, and therefore the operating property becomes highly sensitive to variation in the temperature of the APD 11 or the like. For example, in the graph of FIG. 2, the curves A, B, and C are obtained when the temperature of the APD 11 is $T_M$, $T_L$, and $T_H$, respectively ($T_L < T_M < T_H$). Thus, even when the quantity of light is constant and the supply voltage applied to the APD 11 is fixed to a constant value (for example, $V_M$), the output current value obtained from the APD 11 varies to $I_H$, $I_M$, and $I_L$, depending on the temperature.

In the graph shown in FIG. 2, for example, in order to obtain an output current of $I_M$ (=m·$I_0$, where m is a desired avalanche multiplication factor) with a predetermined quantity of incident light, the supply voltage value should be changed to $V_L$, $V_M$, and $V_H$, according to the variation in the properties of the APD 11. In a conventional method in general use, the temperature of the APD is detected using a thermistor or the like, and the supply voltage is changed depending on the temperature of the APD. However, it is difficult to obtain the desired avalanche multiplication factor m with high accuracy by such method, since an APD has its own temperature characteristics different from those of other APDs.

In comparison, the control part 5 according to the present embodiment controls the avalanche multiplication factor of the APD 11 on the basis of the output current I2 obtained from the PIN-PD 13. First, a quantity of light is caused to be incident on the optical receiver 1 via the optical fiber 15, and the value of the output current I1 obtained by the APD 11 in the PIN mode and the value of the output current I2 obtained by the PIN-PD 13 at that time are defined as $Iava_2$ (A) and $Ipin_2$ (A), respectively. The supply voltage P1 is controlled such that the average value of the output current I1 obtained by the APD 11 when the signal light L1 is incident on the APD 11 approaches m·$Ipin_1$·($Iava_2/Ipin_2$), where m is the desired avalanche multiplication factor and $Ipin_1$ is the current value (A) of the output current I2 obtained by the PIN-PD 13, the output current I2 corresponding to the signal light L1. Accordingly, the desired avalanche multiplication factor m is obtained in the APD 11 without being affected by the temperature variation or the like. The average value of the output current I2 is the time average of the output current I2 corresponding to the coded signal light L1 over a sufficient length of time covering a plurality of codes. The average value of the output current I2 can be obtained using, for example, an integrating circuit.

Figure 3:
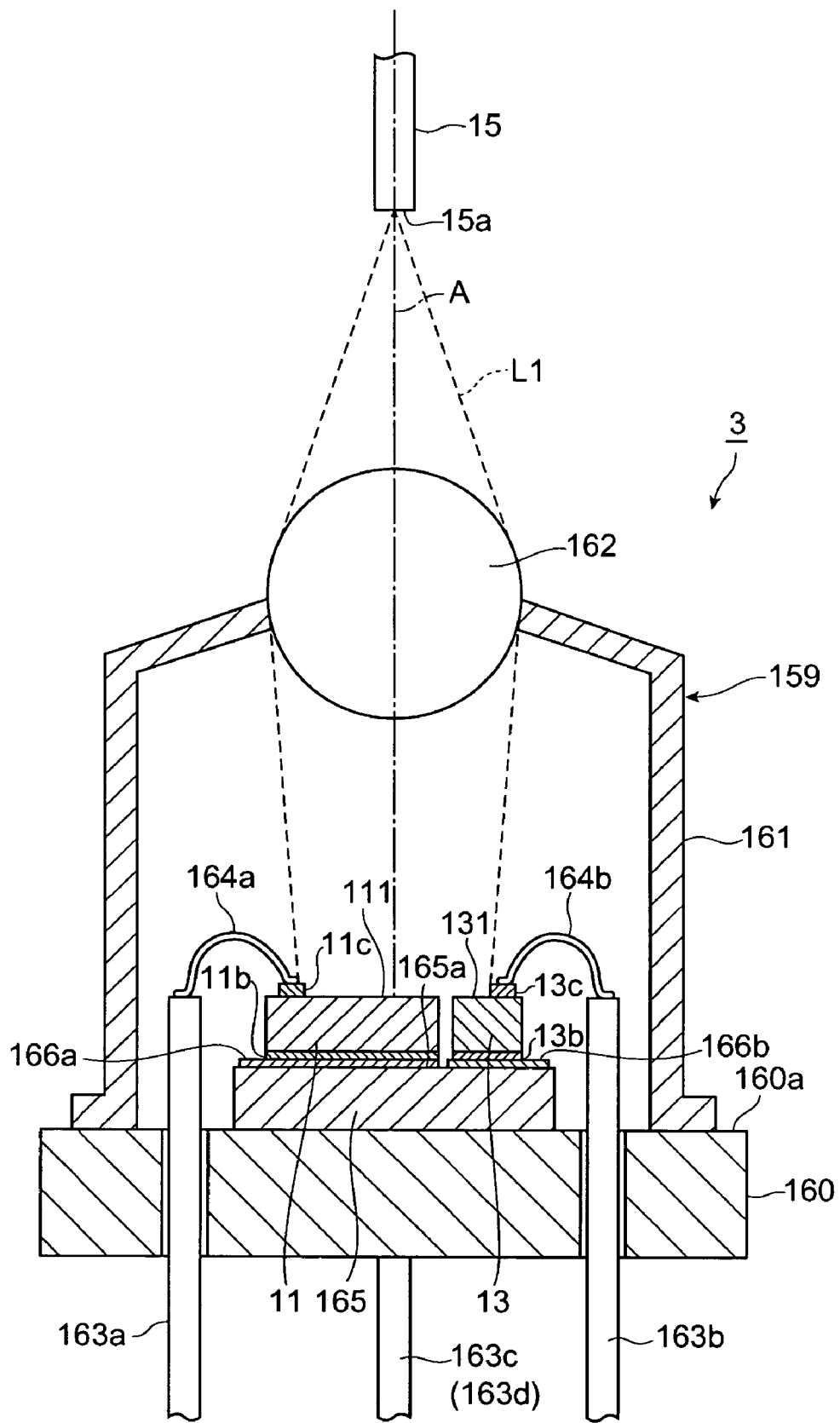
FIG. 3 is a sectional view showing a light-receiving part according to one embodiment of the present invention.

Next, the light-receiving part 3 will be described in detail below. FIG. 3 is a sectional view showing the light-receiving part 3 according to the present embodiment. With reference to FIG. 3, the light-receiving part 3 includes the APD 11, the PIN-PD 13, and a package 159.

The package 159 accommodates the APD 11 and the PIN-PD 13. The package 159 has a structure of a so-called coaxial-type CAN package, and includes a stem 160, a cap 161, a lens 162, a submount 165, and lead pins 163a to 163d.

The stem 160 is a disc-shaped conductive member, and the lead pins 163a to 163d are attached to the stem 160 such that they extend through the stem 160 in the thickness direction. The lead pins 163a to 163d are electrically insulated from the stem 160.

The submount 165 is placed on a principal plane 160a of the stem 160. The submount 165 functions as a mounting member in the present embodiment, and the APD 11 and the PIN-PD 13 are mounted on a principal plane 165a of the submount 165. The submount 165 is insulative, and is composed of, for example, at least one of ceramic, alumina, zirconia, aluminum nitride, and the like.

Wiring patterns 166a and 166b are formed side by side on the principal plane 165a of the submount 165. The APD 11 is placed on the wiring pattern 166a, and the wiring pattern 166a and a cathodic electrode 11b of the APD 11 are electrically connected to each other with solder or the like. The PIN-PD 13 is placed on the wiring pattern 166b, and the wiring pattern 166b and a cathodic electrode 13b of the PIN-PD 13 are electrically connected to each other with solder or the like. The wiring pattern 166a is electrically connected to the lead pin 163c with a bonding wire (not shown), and the wiring pattern 166b is electrically connected to the lead pin 163d with a bonding wire (not shown).

An anodic electrode 11c of the APD 11 is electrically connected to the lead pin 163a with a bonding wire 164a. The APD 11 receives the supply voltage P1 via the lead pin 163c and provides the output current I1 to the outside of the light-receiving part 3 via the lead pin 163a. In the present embodiment, the lead pin 163c is electrically connected to the control part 5 (see FIG. 1) and the lead pin 163a is electrically connected to the amplifier 9 (see FIG. 1).

An anodic electrode 13c of the PIN-PD 13 is electrically connected to the lead pin 163b with a bonding wire 164b. The PIN-PD 13 receives a predetermined supply voltage via the lead pin 163d, and provides the output current I2 to the outside of the light-receiving part 3 via the lead pin 163b. In the present embodiment, the lead pin 163b is electrically connected to the control part 5 (see FIG. 1) and the lead pin 163d is electrically connected to a predetermined power-supply terminal.

The cap 161 covers the APD 11 and the PIN-PD 13. The cap 161 has a cylindrical shape with one end closed, and is composed of, for example, a metal material such as stainless steel, steel, iron-nickel alloy, and brass. The cap 161 is fixed to the stem 160 such that the other end of the cap 161 is in contact with the principal plane 160a of the stem 160. The ball lens 162 is provided at the closed end of the cap 161, and is optically coupled to the light-receiving area 111 of the APD 11 and the light-receiving area 131 of the PIN-PD 13. The lens 162 is disposed between the end 15a of the optical fiber 15 and a place where the APD 11 and the PIN-PD 13 are provided. The signal light L1 emitted from the end 15a of the optical fiber 15 is converged by the lens 162 and is incident on the light-receiving area 111 of the APD 11 and the light-receiving area 131 of the PIN-PD 13.

Figure 4:
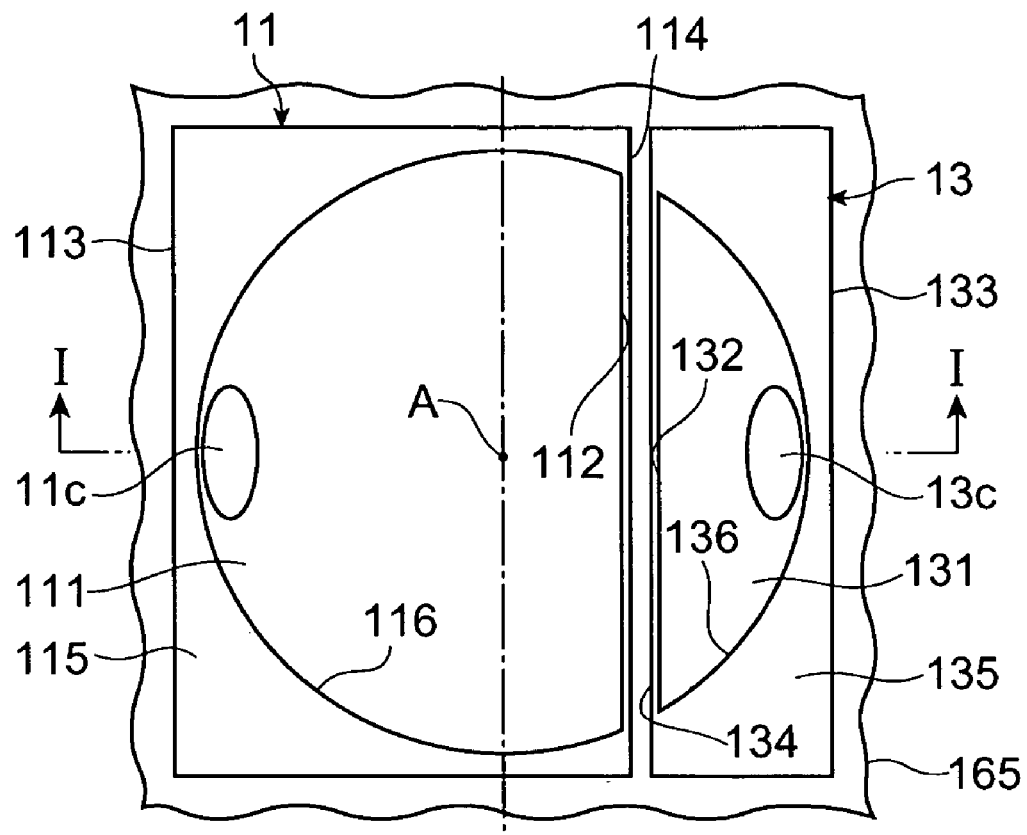
FIG. 4(a) is a plan view showing an APD and a PIN-PD mounted on a submount and FIG. 4(b) is a graph showing an example of a profile of signal light received at light-receiving areas.
Figure 4:
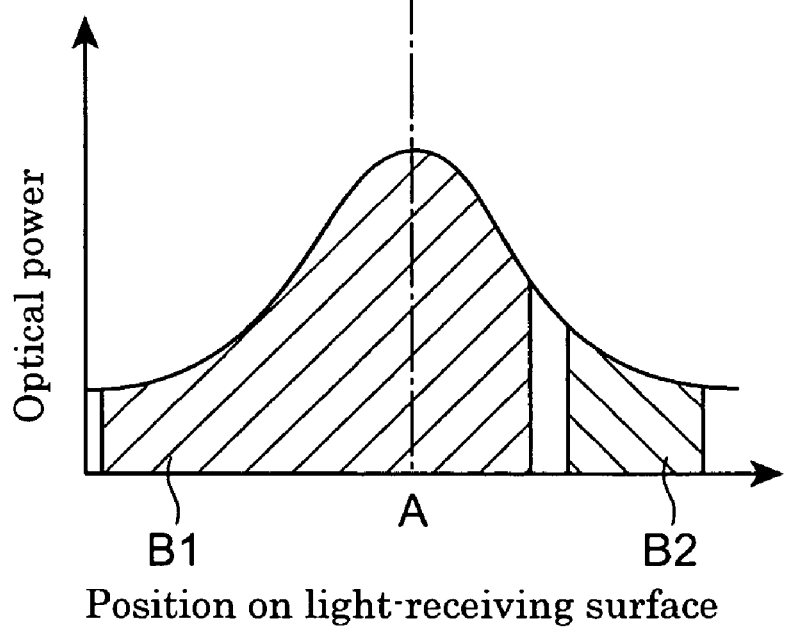
Figure 5:
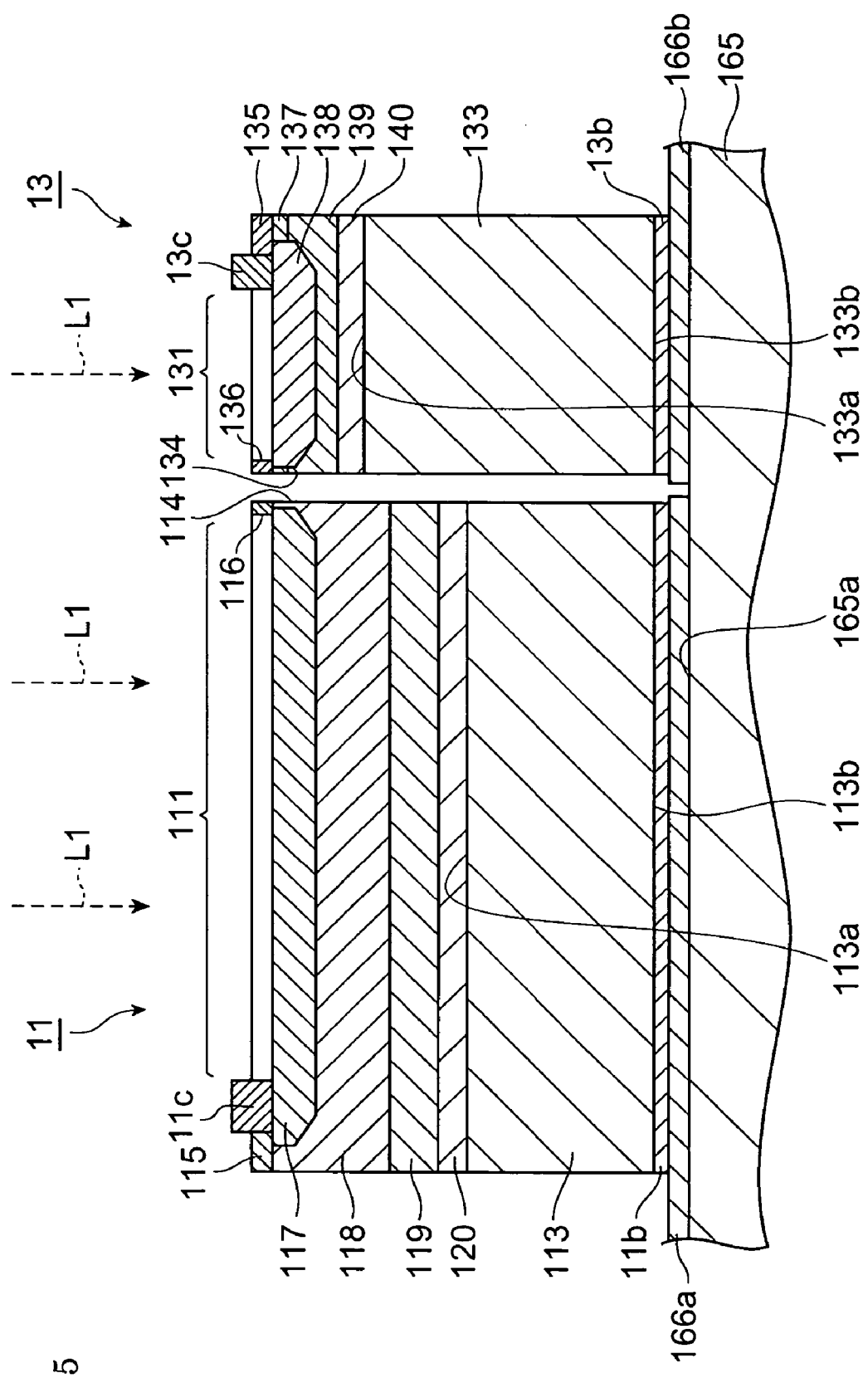
FIG. 5 is a sectional view of the APD and the PIN-PD, showing a cross-section taken along the line I—I in FIG. 4(a)

FIG. 4(a) is a plan view showing the APD 11 and the PIN-PD 13 mounted on the submount 165. FIG. 5 is a sectional view of the APD 11 and the PIN-PD 13 shown in FIG. 4(a), showing a cross-section taken along the line I—I. With reference to FIG. 5, the APD 11 includes a semiconductor substrate 113, an n-type buffer layer 120, an n-type light-receiving layer 119, a multiplication layer 118, a p-type semiconductor layer 117, the anodic electrode 11c, and the cathodic electrode 11b. The n-type buffer layer 120, the n-type light-receiving layer 119, and the multiplication layer 118 are laminated on top of another on a surface 113a of the semiconductor substrate 113. The APD 11 is placed on the submount 165 such that a rear face 113b of the semiconductor substrate 113 faces the principal plane 165a of the submount 165.

The semiconductor substrate 113 functions as a first substrate in the present embodiment, and is composed of, for example, S-doped, high-density n-type InP. The n-type buffer layer 120 is composed of, for example, n-type InP and has a thickness of, for example, 1 μm or less. The n-type light-receiving layer 119 is composed of, for example, n-type InGaAs and has a thickness of, for example, 2 μm or less. The multiplication layer 118 is composed of, for example, n-type InP and has a thickness of, for example, 2 μm or less. The p-type semiconductor layer 117 is formed by implanting Cd ions into a predetermined region near the surface of the multiplication layer 118. The anodic electrode 11c is provided on the p-type semiconductor layer 117, and has a layered structure of, for example, Au and Zn. The cathodic electrode 11b is provided on the rear face 113b of the semiconductor substrate 113, and has a layered structure of, for example, Au, Ge, and Ni.

In addition, a passivation film 115 having an opening 116 is formed, in a region excluding the p-type semiconductor layer 117, on the multiplication layer 118. The passivation film 115 is composed of, for example, an oxide such as SiON. The surface of the p-type semiconductor layer 117 facing outward through the opening 116 functions as the light-receiving area 111 of the APD 11.

For activating the APD 11, a relatively large voltage is applied between the anodic electrode 11c and the cathodic electrode 11b. In the APD 11, when the signal light L1 with a wavelength of, for example, 1.0 μm to 1.6 μm is incident on the light-receiving area 111, the signal light L1 is absorbed by the n-type light-receiving layer 119. Then, carriers are generated in the n-type light-receiving layer 119, the amount of the carriers corresponding to the quantity of the signal light L1 incident on the light-receiving area 111, and are multiplied due to the avalanche multiplication function of the multiplication layer 118 in a high-potential electric field. The thus multiplied carriers are taken out from the anodic electrode 11c as the output current I1 (see FIG. 1).

The PIN-PD 13 includes a semiconductor substrate 133, an n-type buffer layer 140, an n-type light-receiving layer 139, an n-type semiconductor layer 137, a p-type semiconductor layer 138, the anodic electrode 13c, and the cathodic electrode 13b. The n-type buffer layer 140, the n-type light-receiving layer 139, and the n-type semiconductor layer 137 are laminated on top of another on a principal plane 133a of the semiconductor substrate 133. The PIN-PD 13 is placed on the submount 165 such that a rear face 133b of the semiconductor substrate 133 faces the principal plane 165a of the submount 165.

The semiconductor substrate 133 functions as a second substrate in the present embodiment. The semiconductor substrate 133 is composed of, for example, high-density n-type InP and has a thickness of, for example, 150 μm to 300 μm. The n-type buffer layer 140 is composed of, for example, n-type InP and has a thickness of, for example, 1 μm to 2 μm. The n-type light-receiving layer 139 is composed of, for example, n-type InGaAs and has a thickness of, for example, 2 μm to 4 μm. The n-type semiconductor layer 137 is composed of, for example, n-type InP and has a thickness of, for example, 1 μm to 2 μm. The p-type semiconductor layer 138 is formed by implanting, for example, Cd ions into a predetermined region in the n-type semiconductor layer 137 and the n-type light-receiving layer 139. The anodic electrode 13c is provided on a part of the surface of the p-type semiconductor layer 138, and the cathodic electrode 13b is provided on the rear face 133b of the semiconductor substrate 133.

In addition, a passivation film 135 having an opening 136 is formed, in a region excluding the p-type semiconductor layer 138, on the n-type semiconductor layer 137. The passivation film 135 is composed of, for example, an oxide such as SiON. The surface of the p-type semiconductor layer 138 facing outward through the opening 136 functions as the light-receiving area 131 of the PIN-PD 13.

In the PIN-PD 13, when the signal light L1 with a wavelength of, for example, 1.0 μm to 1.6 μm is incident on the light-receiving area 131, the signal light L1 is absorbed by the n-type light-receiving layer 139. Then, carriers are generated in the n-type light-receiving layer 139 according to the optical power of the signal light L1 incident on the light-receiving area 131, and are taken out from the anodic electrode 13c as an output current $I_2$ (see FIG. 1).

With reference to FIG. 4(a), the APD 11 and the PIN-PD 13 are both rectangular in plan view. The light-receiving area 111 of the APD 11 is shaped like a circle from which a portion is cut off, and the light-receiving area 131 of the PIN-PD 13 is shaped similar to the cut-off portion of the circle. A side 112 of the light-receiving area 111 and a side 132 of the light-receiving area 131 extend along each other. More specifically, a face 114 of the APD 11 and a face 134 of the PIN-PD 13 face each other with a gap therebetween, the side 112 of the light-receiving area 111 extending along the face 114 of the APD 11 and the side 132 of the light-receiving area 131 extending along the face 134 of the PIN-PD 13.

FIG. 4(b) is a graph showing an example of a profile of the signal light L1 received by the light-receiving areas 111 and 131. As shown in FIG. 4(b), the APD 11 and the PIN-PD 13 are arranged on the submount 165 such that a position corresponding to the peak in the profile of the signal light L1 is in the light-receiving area 111 of the APD 11. In the present embodiment, the position corresponding to the peak in the profile of the signal light L1 is on the optical axis A of the signal light L1. Accordingly, the APD 11 and the PIN-PD 13 are arranged such that the optical axis A of the signal light L1 intersects the light-receiving area 111 of the APD 11. In the profile shown in FIG. 4(b), the area B1 including the peak corresponds to light incident on the APD 11, and the other area B2 corresponds to light incident on the PIN-PD 13.

Figure 6:
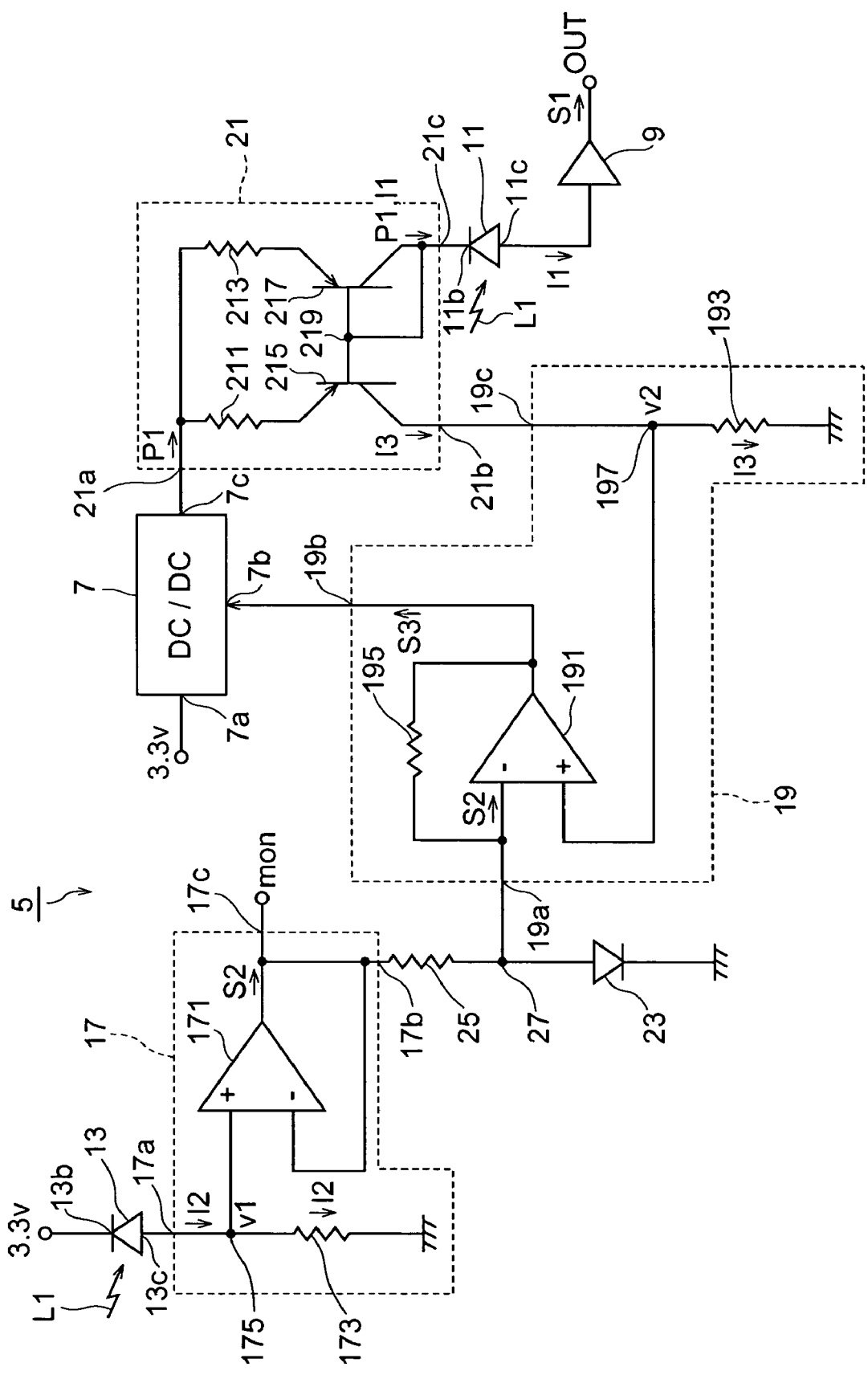
FIG. 6 is a circuit diagram showing an internal circuit of a control part.

Next, the control part 5 will be described in detail below. FIG. 6 is a circuit diagram showing an internal circuit of the control part 5.

With reference to FIG. 6, the control part 5 includes a DC-DC converter 7, a converting circuit 17, a current mirror circuit 21, and a voltage control circuit 19. The DC-DC converter 7 is used as a power supply circuit in the present embodiment, and has inputs 7a and 7b and an output 7c. The input 7a is electrically connected to a power-supply terminal of a predetermined voltage (for example, 3.3 V). The output 7c is electrically connected to the current mirror circuit 21. The input 7b is electrically connected to the voltage control circuit 19, and the DC-DC converter 7 receives a control signal S3, which will be described below, from the voltage control circuit 19. The DC-DC converter 7 transforms the supply voltage from the power-supply terminal on the basis of the control signal S3, and generates the supply voltage P1. Then, the DC-DC converter 7 supplies the supply voltage P1 to the current mirror circuit 21 from the output 7c.

The current mirror circuit 21 includes resistance elements 211 and 213 and PNP transistors 215 and 217. In addition, the current mirror circuit 21 has an input 21a, an output 21b (second output), and an output 21c (first output). The current mirror circuit 21 is structured such that the amount of current at the output 21b is substantially equal to the amount of current at the output 21c. The emitter terminal of the transistor 215 is electrically connected to the input 21a via the resistance element 211. The emitter terminal of the transistor 217 is electrically connected to the input 21a via the resistance element 213. The input 21a of the current mirror circuit 21 is electrically connected to the output 7c of the DC-DC converter 7, and receives the supply voltage P1 from the DC-DC converter 7. The base terminal of the transistor 215 and that of the transistor 217 are electrically connected to each other via a node 219. The node 219 is electrically connected to the collector terminal of the transistor 217. The collector terminal of the transistor 215 is electrically connected to the output 21b of the current mirror circuit 21. The collector terminal of the transistor 217 is electrically connected to the cathodic electrode 11b of the APD 11 via the output 21c of the current mirror circuit 21. As described above, the anodic electrode 11c of the APD 11 is electrically connected to the amplifier 9.

The converting circuit 17 includes a buffer amplifier 171 and a resistance element 173. In addition, the converting circuit 17 has an input 17a and outputs 17b and 17c. One end of the resistance element 173 is electrically connected to the anodic electrode 13c of the PIN-PD 13 via a node 175 and the input 17a. The cathodic electrode 13b of the PIN-PD 13 is electrically connected to a power-supply terminal of a predetermined voltage (for example, 3.3 V). The other end of the resistance element 173 is electrically connected to a reference voltage wire. A positive input terminal of the buffer amplifier 171 is electrically connected to the node 175, and a negative input terminal of the buffer amplifier 171 is electrically connected to an output terminal of the buffer amplifier 171. The output terminal of the buffer amplifier 171 is electrically connected to a monitor terminal via the output 17c, and is also electrically connected to one end of a resistance element 25 via the output 17b. The other end of the resistance element 25 is electrically connected to a reference voltage wire via a node 27 and a diode 23.

The voltage control circuit 19 includes an OP amplifier 191 and resistance elements 193 and 195. In addition, the voltage control circuit 19 has inputs 19a and 19c and an output 19b. A negative input terminal of the OP amplifier 191 is electrically connected to the node 27 via the input 19a, and is also electrically connected to an output terminal of the OP amplifier 191 via the resistance element 195. The output terminal of the OP amplifier 191 is electrically connected to the input 7b of the DC-DC converter 7 via the output 19b of the voltage control circuit 19. A positive input terminal of the OP amplifier 191 is electrically connected to a node 197. The node 197 is electrically connected to a reference voltage wire via the resistance element 193, and is also electrically connected to the output 21b of the current mirror circuit 21 via the input 19c of the voltage control circuit 19.

Next, the operation of the optical receiver 1 according to the present embodiment will be described below. As shown in FIGS. 1 and 3, when the signal light L1 propagated through the optical fiber 15 is incident on the light-receiving part 3, a part of the signal light L1 is incident on the light-receiving area 111 of the APD 11 and another part of the signal light L1 is incident on the light-receiving area 131 of the PIN-PD 13.

With reference to FIG. 6 again, a reverse bias voltage of 3.3 V is applied between the cathodic electrode 13b and the anodic electrode 13c of the PIN-PD 13, and the output current I2 corresponding to the optical power of incident light flows as a result of the signal light L1 being incident on the PIN-PD 13. The output current I2 is input to the converting circuit 17, flows through the node 175 and the resistance element 173, and reaches the reference voltage wire. Accordingly, a potential V1 is generated at the node 175 by the resistance element 173. The potential V1 is input to the buffer amplifier 171, and thus a voltage signal S2 corresponding to the quantity of light incident on the PIN-PD 13 is generated.

The voltage signal S2 generated by the converting circuit 17 is output from the output 17b of the converting circuit 17, and is input to the voltage control circuit 19 via the resistance element 25 and the node 27. At this time, if light of excessive quantity is input to the PIN-PD 13 and the voltage value of the voltage signal S2 exceeds a predetermined limit, the diode 23 serves to prevent the OP amplifier 191 from receiving excessive amounts of current.

The DC-DC converter 7 applies the supply voltage P1, as a reverse bias voltage via the current mirror circuit 21, between the cathodic electrode 11b and the anodic electrode 11c of the APD 11. When the signal light L1 is incident on the APD 11, the output current I1 corresponding to the quantity of the signal light incident thereon flows in the APD 11. The amplifier 9 generates the received signal S1 by converting the output current I1 into a voltage signal, and the received signal S1 is supplied to the outside of the optical receiver 1. At this time, the current mirror circuit 21 operates such that the amount of current I3 which flows through the resistance element 211 and the transistor 215 is substantially equal to the amount of current I1 which flows through the resistance element 213 and the transistor 217. The current I3 is output from the output 21b of the current mirror circuit 21, flows through the input 19c of the voltage control circuit 19, the node 197, and the resistance element 193, in that order, and reaches the reference voltage wire. When the current I3 flows through the resistance element 193 of the voltage control circuit 19, a potential V2 is generated at the node 197. The potential V2 is input to the positive input terminal of the OP amplifier 191.

In addition, the voltage signal S2 generated by the converting circuit 17 and input to the voltage control circuit 19 is supplied to the negative terminal of the OP amplifier 191. Since the output terminal of the OP amplifier 191 is fed back to the negative input terminal of the OP amplifier 191 via the resistance element 195, the difference between the voltage signal S2 and the potential V2 is amplified with a predetermined factor, and the control signal S3 is thus generated. More specifically, the value of the control signal S3 increases when the ratio between the output current I1 of the APD 11 and the output current I2 of the PIN-PD 13 deviates from a predetermined ratio. When the DC-DC converter 7 receives the control signal S3 from the voltage control circuit 19, it adjusts the voltage value of the supply voltage P1 such that the value of the control signal S3 approaches 0.

Due to the above-described operation, the supply voltage P1 applied to the APD 11 is controlled and the avalanche multiplication factor m of the APD 11 is maintained at the desired value. In the present embodiment, the resistance of the resistance element 193 may be determined on the basis of the product of the ratio of Iava2 to Ipin2 and the desired avalanche multiplication factor m ($=m\cdot(\text{Iava2}/\text{Ipin2})$), where Iava2 is a measured current value of the output current I1 obtained by the APD 11 in the PIN mode when a quantity of light is incident, and Ipin2 is a measured current value of the output current I2 obtained by the PIN-PD 13 at that time. The avalanche multiplication factor m can be changed by changing the resistance of the resistance element 193. When the resistance element 193 is a digital potentiometer, the avalanche multiplication factor m can be changed by an external signal. Examples of parameters used in the circuit diagram of FIG. 6 are shown below:

Output Current I1: 10 µA (Quantity of Light Incident on APD 11: 0.95 µW)
Output Current I2: 50 nA (Quantity of Light Incident on PIN-PD 13: 0.05 µW)
Current I3: 10 µA
Resistance Element 173: 100 kΩ
Resistance Element 193: 500 kΩ
Resistance Element 195: Preferably large enough to prevent the oscillation of a closed-loop relating to the OP amplifier 191.
Resistance Element 211: 1 kΩ
Resistance Element 213: 1 kΩ
Supply Voltage P1: 50 V
Potential V1: 5 mV
Potential V2: 5 mV As for the current I3 and the resistance elements 211, 213, and 193, the following parameters may be adopted instead of those mentioned above. In this case, the power consumption of the DC-DC converter 7 can be reduced to 11/20 compared to the case of the above-mentioned parameters.

Current I3: 1 µA
Resistance Element 211: 10 kΩ
Resistance Element 213: 1 kΩ
Resistance Element 193: 5 MΩ

The optical receiver 1 according to the present embodiment provides the following advantages. That is, in the optical receiver 1, the APD 11 and the PIN-PD 13 are formed on different semiconductor substrates (113 and 133 respectively). Accordingly, crosstalk between the APD 11 and the PIN-PD 13 is prevented. In addition, in the optical receiver 1, the signal light L1 emitted from the optical fiber 15 is incident on the light-receiving area 111 and the light-receiving area 131 of the APD 11 and the PIN-PD 13, respectively, along a single optical axis A at the same time. Accordingly, unlike the structure disclosed in Japanese Unexamined Patent Application Publication No. 63-105541, the signal light L1 is not reflected. Therefore, the signal light L1 can be caused to be incident on the APD 11 and the PIN-PD 13 without the quantity of light thereof being varied depending on the polarization state of the signal light L1. Thus, in the optical receiver 1 of the present embodiment, the avalanche multiplication factor of the APD 11 can accurately be controlled on the basis of the output current I2 of the PIN-PD 13.

A PIN-PD is preferably used as a photodetector as in the present embodiment. Since the output current value of a PIN-PD is substantially linear with respect to the quantity of received light, the avalanche multiplication factor of the APD 11 can easily be controlled when the optical receiver 1 is provided with the PIN-PD 13 as a photodetector.

In addition, in the optical receiver 1 of the present embodiment, the side 112 of the light-receiving area 111 of the APD 11 and the side 132 of the light-receiving area 131 of the PIN-PD 13 extend along each other. The optical receiver is preferably structured in this manner, and accordingly it is possible to reduce the region which exists between the light-receiving area 111 and the light-receiving area 131 and which does not receive the signal light L1. Thus, the signal light L1 is efficiently received by the APD 11 and the PIN-PD 13.

In the optical receiver 1 of the present embodiment, the position corresponding to the peak in the profile of the signal light L1 emitted from the end 15a of the optical fiber 15 is in the light-receiving area 111 of the APD 11. The PIN-PD 13 is used simply to control the avalanche multiplication factor of the APD 11, and therefore it does not require the quantity of light as much as the APD 11. Accordingly, the optical receiver is preferably structured in this manner, and in such a case, light corresponding to the central area of the signal-light profile (area B1 in FIG. 4(b)) is received by the APD 11 and light corresponding to a part of the peripheral area of the signal-light profile (area B2 in FIG. 4(b)) is received by the PIN-PD 13. Accordingly, the quantity of light incident on the APD 11 is larger than the quantity of light incident on the PIN-PD 13, and thus the signal light L1 can be shared suitably between the APD 11 and the PIN-PD 13.

The optical receiver 1 according to the present embodiment includes the control part 5 for controlling, on the basis of the current value of the output current I2 from the PIN-PD 13, the supply voltage P1 to be applied to the APD 11 such that the avalanche multiplication factor m of the APD 11 is maintained at a predetermined value. The optical receiver 1 preferably includes such a control part 5, and thereby the avalanche multiplication factor m of the APD 11 can be suitably controlled.

First Modification

Figure 7:
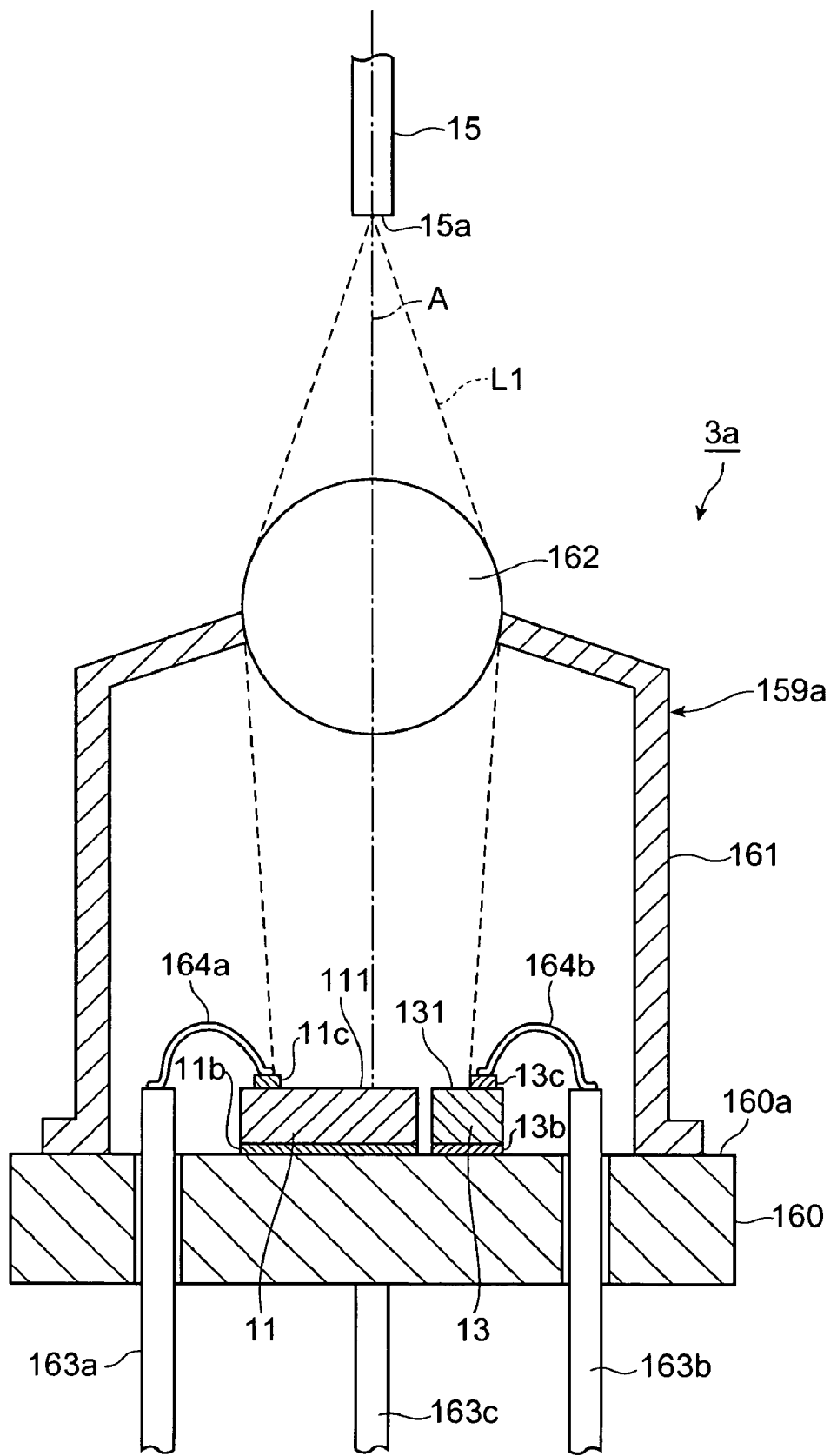
FIG. 7 is a sectional view showing the light-receiving part of an optical receiver according to a first modification of the above-mentioned embodiment.

FIG. 7 is a sectional view showing a light-receiving part 3a as a first modification of the optical receiver 1 according to the above-described embodiment. The light-receiving part 3a of the present modification is different from the light-receiving part 3 of the above-described embodiment in that a package 159a does not include a submount. More specifically, in the present modification, a stem 160 functions as a mounting member on which an APD 11 and a PIN-PD 13 are mounted. With reference to FIG. 7, in the package 159a, the APD 11 and the PIN-PD 13 are mounted on a principal plane 160a of the stem 160. In the present modification, the stem 160 is composed of a conductive material, and a cathodic electrode 11b of the APD 11 and a cathodic electrode 13b of the PIN-PD 13 are electrically connected to the stem 160 with solder or the like. The stem 160 is electrically connected to a lead pin 163c, and a supply voltage is supplied to the cathodic electrode 11b of the APD 11 and the cathodic electrode 13b of the PIN-PD 13 via the lead pin 163c. The optical receiver may include the light-receiving part 3a according to the present modification in place of the light-receiving part 3 according to the above-described embodiment.

Second Modification

Figure 8:
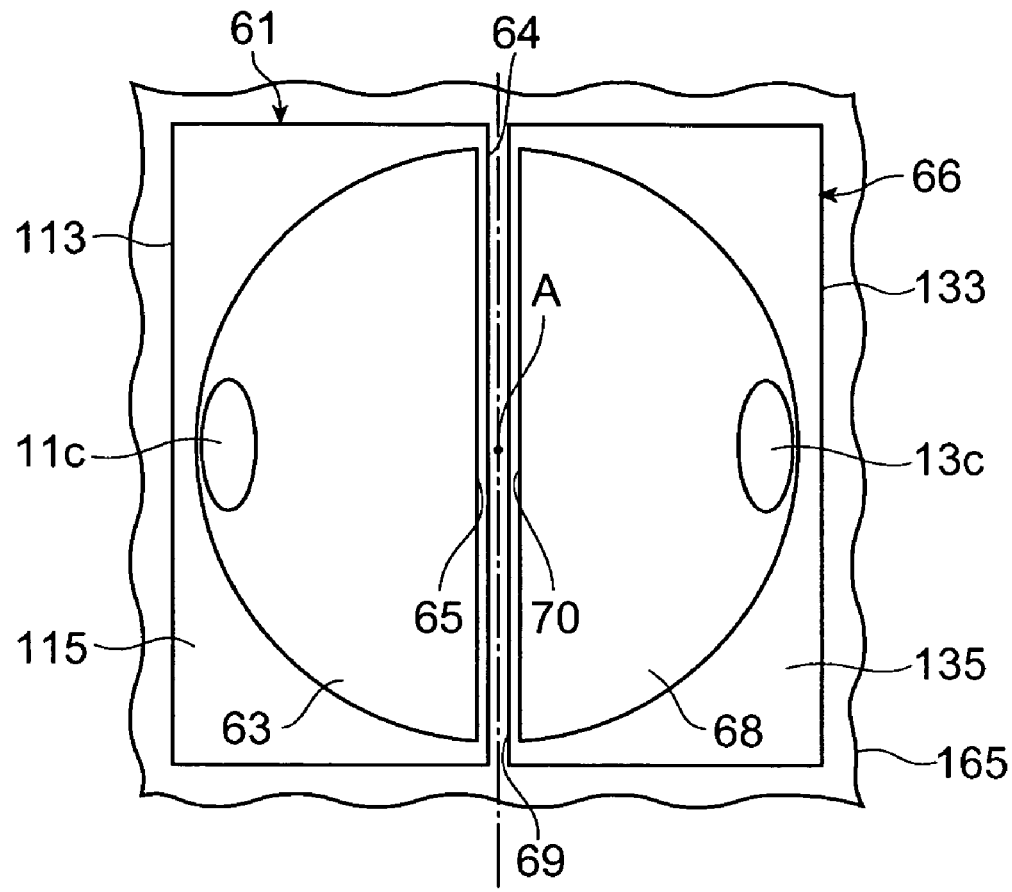
FIG. 8(a) is a plan view showing an APD and a PIN-PD of an optical receiver according to a second modification of the embodiment.
FIG. 8(b) is a graph showing an example of a profile of signal light received at a light-receiving area of the second modification.
Figure 8:
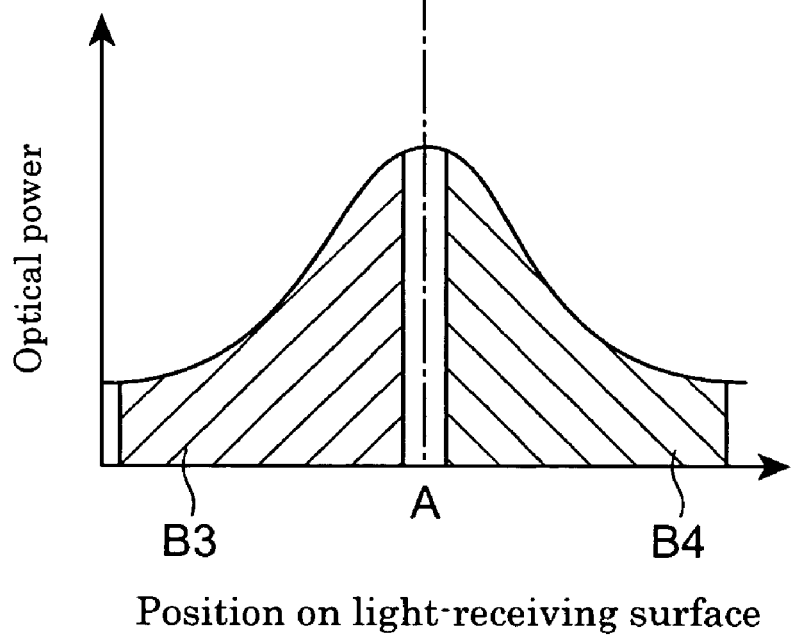

FIG. 8(a) is a plan view showing an APD 61 and a PIN-PD 66 as a second modification of the optical receiver 1 according to the above-described embodiment. In the present modification, a light-receiving area 63 of the APD 61 and a light-receiving area 68 of the PIN-PD 66 are both semicircular. A linear side 65 of the semicircular light-receiving area 63 and a linear side 70 of the semicircular light-receiving area 68 extend along each other. More specifically, a side face 64 of the APD 61 and a side face 69 of the PIN-PD 66 face each other with a gap therebetween, the side 65 of the light-receiving area 63 extending along the side face 64 of the APD 61 and the side 70 of the light-receiving area 68 extending along the side face 69 of the PIN-PD 66. An optical axis A of signal light does not intersect the light-receiving areas 63 and 68, and extends through a gap between the APD 61 and the PIN-PD 66.

The APD and the PIN-PD may be structured in a manner similar to the APD 61 and the PIN-PD 66, respectively, according to the present modification. In this case, as shown in FIG. 8(b), the APD 61 receives light corresponding to the area B3, which is a half of an area excluding the peak in the profile of the signal light L1, and the PIN-PD 66 receives light corresponding to the area B4, which is the other half of the area excluding the peak in the profile of the signal light L1.

Third Modification

Figure 9:
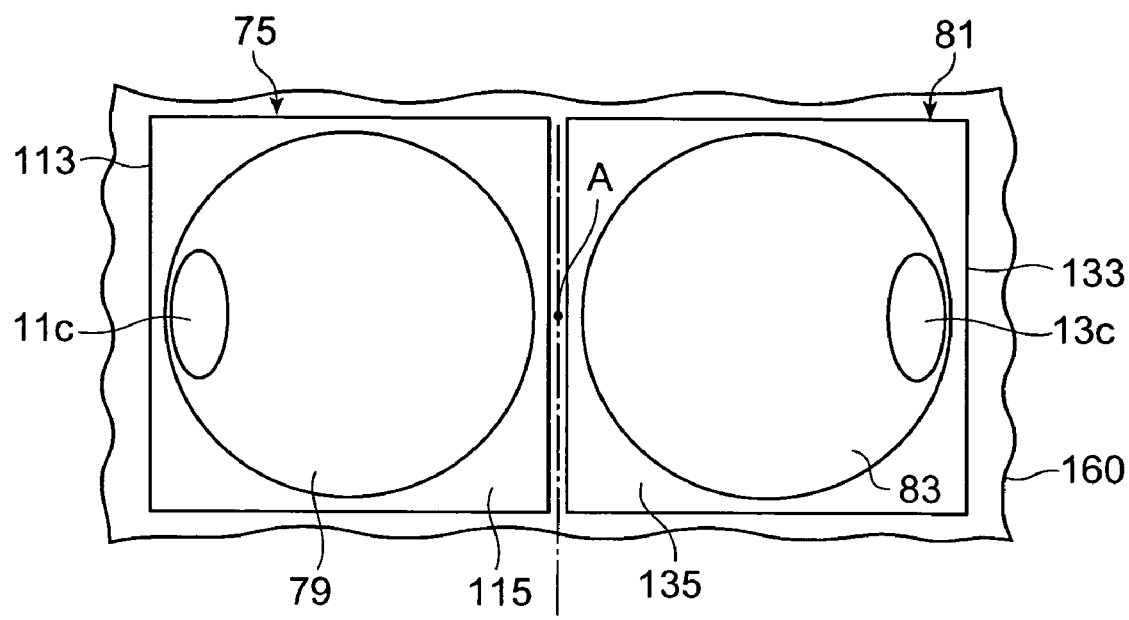
FIG. 9(a) is a plan view showing an APD and a PIN-PD of an optical receiver according to a third modification of the embodiment.
FIG. 9(b) is a graph showing an example of a profile of signal light received at a light-receiving area of the third modification.
Figure 9:
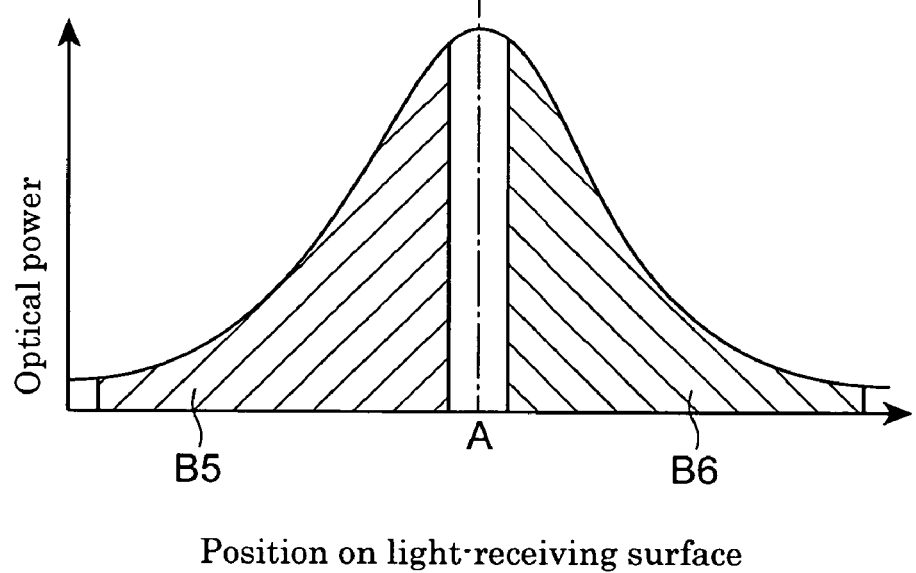

FIG. 9(a) is a plan view showing an APD 75 and a PIN-PD 81 as a third modification of the optical receiver 1 according to the above-described embodiment. In the present modification, a light-receiving area 79 of the APD 75 and a light-receiving area 83 of the PIN-PD 81 are both circular. The APD and the PIN-PD may be structured in a manner similar to the APD 75 and the PIN-PD 81, respectively, according to the present modification. In this case, as shown in FIG. 9(b), the APD 75 receives light corresponding to the area B5, which is a half of an area excluding the peak in the profile of signal light L1, and the PIN-PD 81 receives light corresponding to the area B6, which is the other half of the area excluding the peak in the profile of the signal light L1. However, since the centers of the light-receiving areas 79 and 83 are in the peripheral region of the profile, the quantity of received light is smaller than that in the above-described second modification.

Fourth Modification

Figure 10:
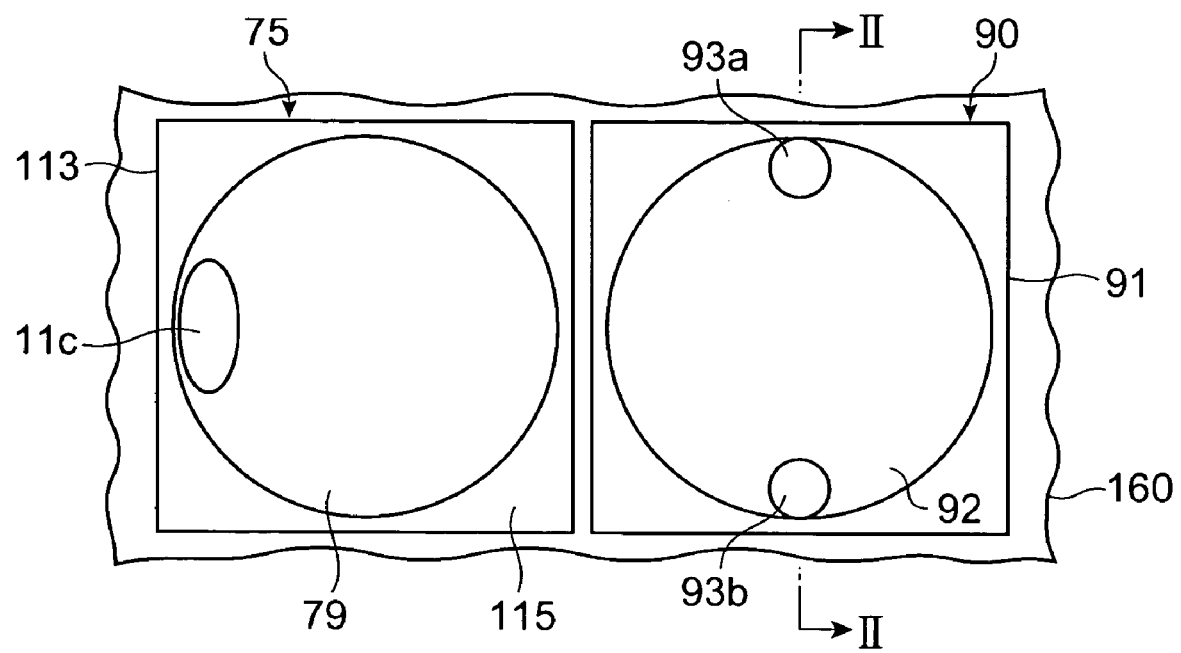
FIG. 10(a) is a plan view showing an APD and a photoconductive element of an optical receiver according to a fourth modification of the embodiment.
FIG. 10(b) is a sectional view of the photoconductive element, showing a cross-section taken along line II—II in FIG. 10(a)
Figure 10:
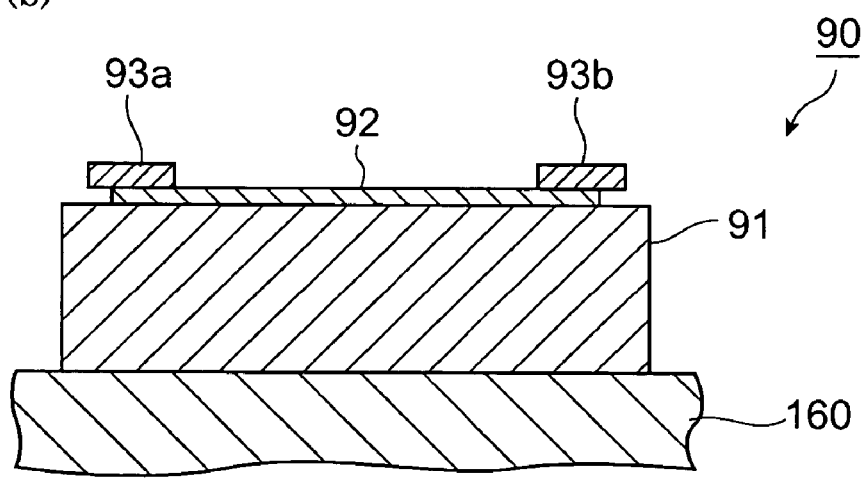

FIG. 10(a) is a plan view showing an APD 75 and a photoconductive element 90 as a fourth modification of the optical receiver 1 according to the above-described embodiment. FIG. 10(b) is a sectional view of the photoconductive element 90 shown in FIG. 10(a), illustrating a cross-section taken along the line II—II. The optical receiver according to the present modification includes the photoconductive element 90 in place of the PIN-PD 81 according to the third modification. The photoconductive element 90 functions as a photodetector in the present modification, and includes a substrate 91 and a photoconductor 92. The photoconductor 92 is composed of a material whose resistance varies depending on the quantity of received light, and an area where the photoconductor 92 is provided functions as a light-receiving area for receiving signal light L1 in the photoconductive element 90. The photoconductor 92 is composed of at least one of CdS, PbS, PbSe, Si, Ge, InGaAs, and the like.

The photoconductor 92 is formed on the substrate 91 in a circular shape. The substrate 91 functions as a second substrate in the present modification. The substrate 91 is composed of, for example, an insulative material, and is rectangular in plan view. The substrate 91 is placed adjacent to the APD 75 on a stem 160. The end 15a of the optical fiber 15 and the photoconductor 92 are optically coupled to each other so that the photoconductor 92 receives a part of the signal light L1 (see FIG. 3) emitted from the end 15a of the optical fiber 15 along an optical axis A.

The photoconductive element 90 includes two electrodes 93a and 93b. The electrodes 93a and 93b are disposed separately from each other on the photoconductor 92. The electrodes 93a and 93b are electrically connected to lead pins 163b and 163d (see FIG. 3), respectively, and a predetermined voltage is applied between the electrodes 93a and 93b via the lead pins 163b and 163d. When the signal light L1 is incident on the photoconductor 92, the resistance of the photoconductor 92 changes and the value of a current (output current) which flows between the electrodes 93a and 93b also changes accordingly. This output current is supplied to the control part 5 (see FIG. 1), and accordingly the quantity of the signal light L1 incident on the photoconductor 92 is detected.

The optical receiver according to the present modification provides advantages similar to those obtained by the optical receiver 1 according to the above-described embodiment. More specifically, the avalanche multiplication factor of the APD 75 can be accurately controlled on the basis of the output current value from the photoconductive element 90. Since the output current value of a photoconductor made of a material such as CdS is substantially linear with respect to the quantity of received light, the avalanche multiplication factor of the APD 75 can easily be controlled when the optical receiver includes the photoconductive element 90 as a photodetector. A photoconductor is particularly suitable for use as a photodetector element for controlling the avalanche multiplication factor of the APD 75 because it exhibits a characteristic of high linearity with respect to weak light.

Fifth Modification

Figure 11:
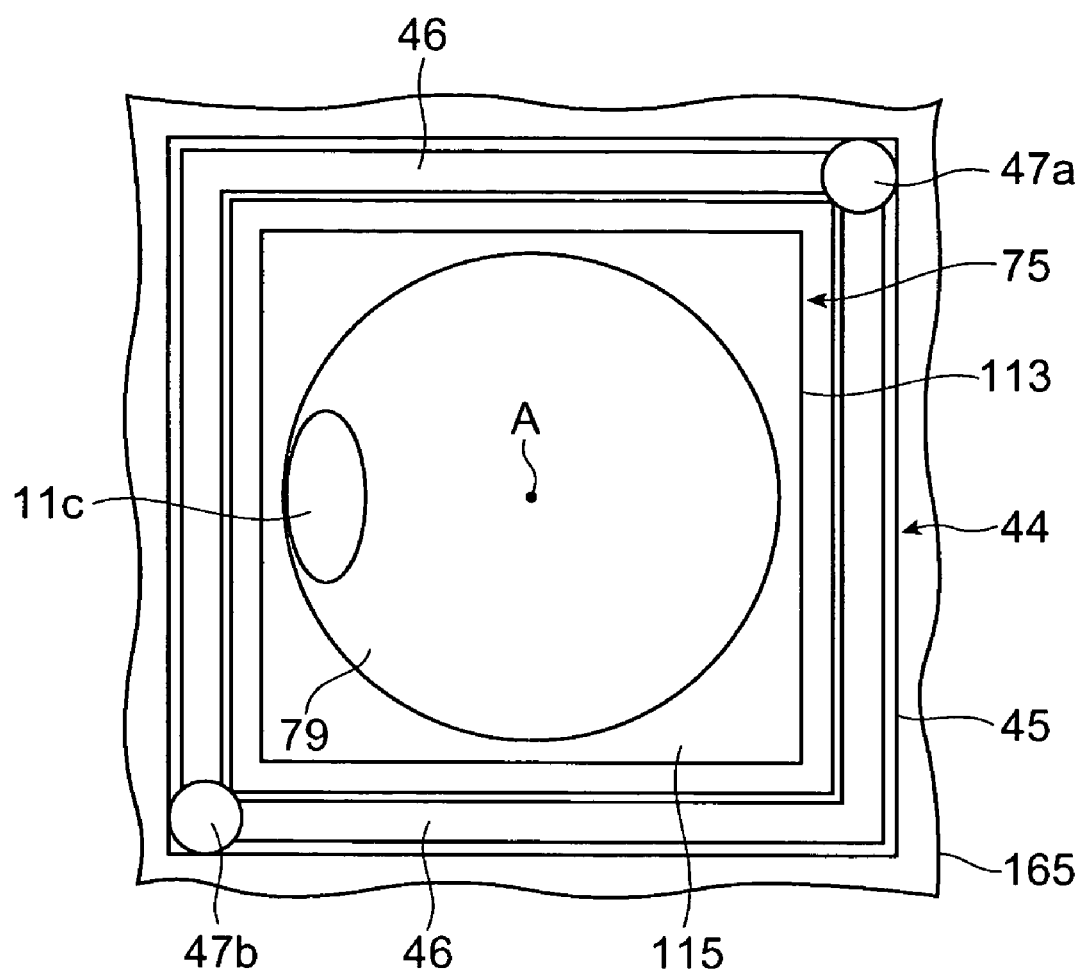
FIG. 11 is a plan view showing an APD and a photoconductive element of an optical receiver according to a fifth modification of the embodiment.

FIG. 11 is a plan view showing an APD 75 and a photoconductive element 44 as a fifth modification of the optical receiver 1 according to the above-described embodiment. In the present modification, the photoconductive element 44 is placed surrounding the APD 75. More specifically, a frame-shaped substrate 45 surrounds the APD 75, and a photoconductor 46 is formed on the substrate 45. The photoconductive element 44 includes electrodes 47a and 47b which are disposed at two diagonal corners of the photoconductor 46 having four corners. The APD 75 and the photoconductive element 44 are arranged such that an optical axis A of signal light L1 intersects a light-receiving area 79 of the APD 75.

According to the present modification, a structure can be easily made such that the light-receiving area 79 of the APD 75 receives a part of the signal light L1 (see FIG. 3) emitted from an end 15a of an optical fiber 15 along the optical axis A and the photoconductor 46 receives the other part of the signal light L1.

Sixth Modification

FIG. 12(a) is a plan view showing an APD 11 and a photoconductive element 94 as a sixth modification of the optical receiver 1 according to the above-described embodiment. In the present modification, a light-receiving area 111 of the APD 11 has a shape like a partially cut off circle, as in the above-described embodiment, and a photoconductor 96 provided in the photoconductive element 94 has a shape similar to the cut-off portion of the circle. A side 112 of the light-receiving area 111 and a side 96a of the photoconductor 96 extend along each other. More specifically, a side face 114 of the APD 11 and a side face 98 of the photoconductive element 94 face each other with a gap therebetween, the side 112 of the light-receiving area 111 extending along the side face 114 of the APD 11 and the side 96a of the photoconductor 96 extending along the side face 98 of the photoconductive element 94. Electrodes 97a and 97b are provided at both ends of the photoconductor 96. The APD 11 and the photoconductive element 94 are arranged on the stem 160 such that an optical axis A of signal light L1 intersects the light-receiving area 111 of the APD 11. The optical receiver having the structure of the present modification provides advantages similar to those obtained by the above-described embodiment.

Seventh Modification

FIG. 12(b) is a plan view showing an APD 61 and a photoconductive element 40 as a seventh modification of the optical receiver 1 according to the above-described embodiment. In the present embodiment, a light-receiving area 63 of the APD 61 and a photoconductor 42 of the photoconductive element 40 are both semicircular. A linear side 65 of the semicircular light-receiving area 63 and a linear side 42a of the semicircular photoconductor 42 extend along each other. More specifically, a side face 64 of the APD 61 and a side face 49 of the photoconductive element 40 face each other with a gap therebetween, the side 65 of the light-receiving area 63 extending along the side face 64 of the APD 61 and the side 42a of the photoconductor 42 extending along the side face 49 of the photoconductive element 40. Electrodes 43a and 43b are provided at both ends of the semicircular photoconductor 42. An optical axis A of signal light does not intersect the light-receiving area 63 and the photoconductor 42, and extends through a gap between the APD 61 and the photoconductive element 40. The APD and the photoconductive element may be structured in a manner similar to the APD 61 and the photoconductive element 40, respectively, and with such structure advantages similar to those obtained in the second modification can be attained.

Eighth Modification

Figure 13:
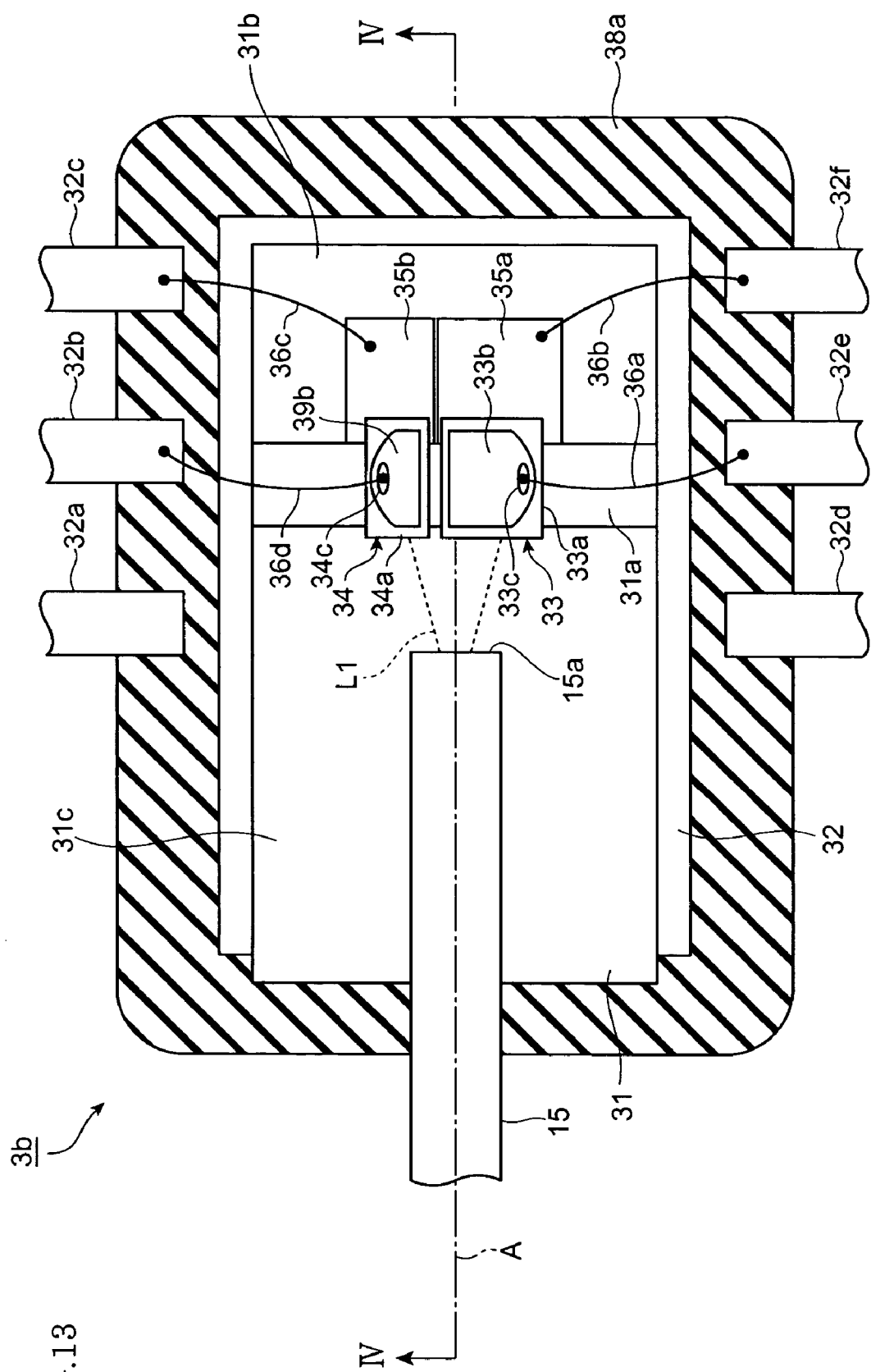
FIG. 13 is a plan view showing a light-receiving part of an optical receiver according to an eighth modification of the embodiment.
Figure 14:
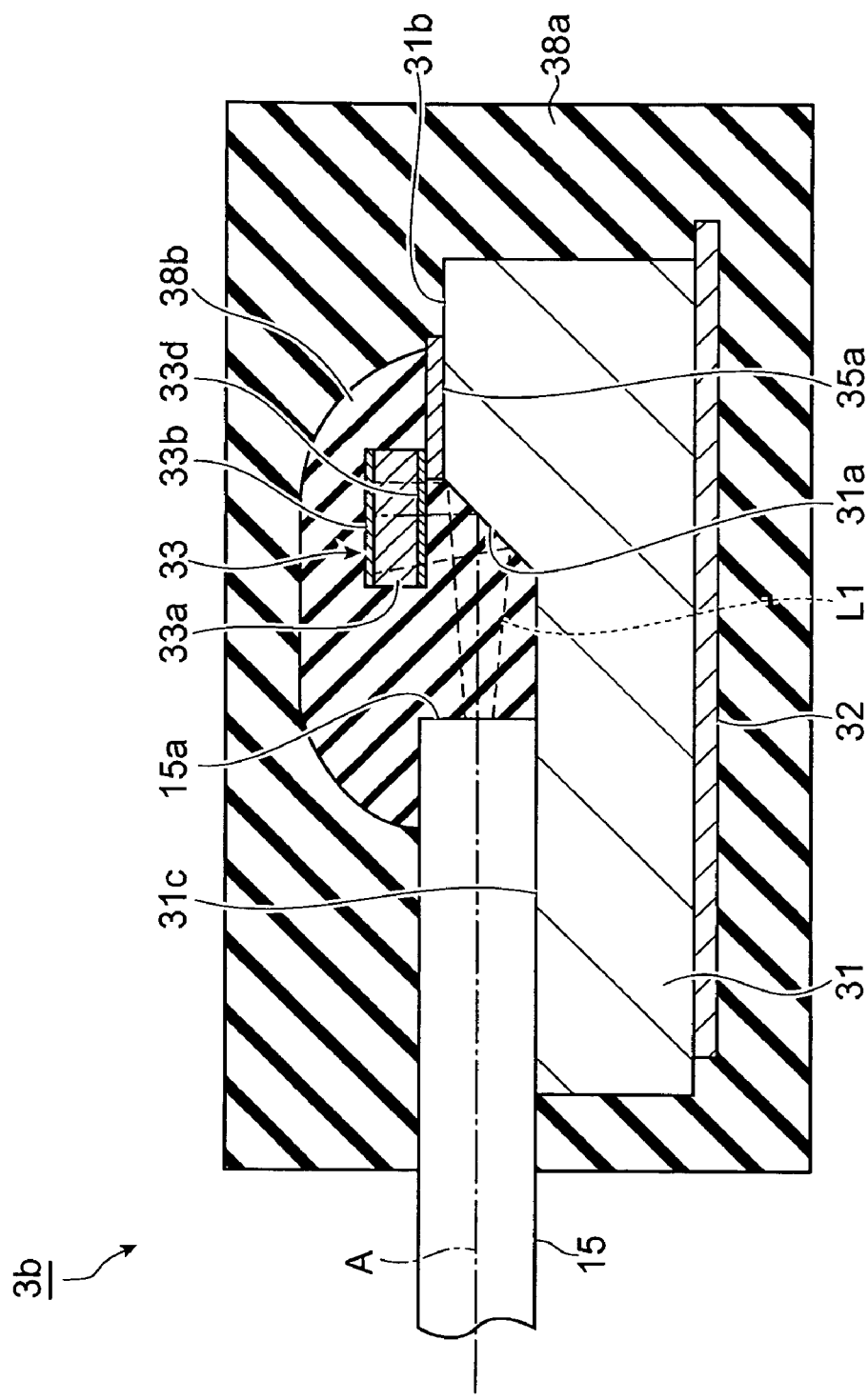
FIG. 14 is a sectional view of the light-receiving part shown in FIG. 13, showing a cross-section taken along the line IV—IV.

FIG. 13 is a plan view showing a light-receiving part 3b as an eighth modification of the optical receiver 1 according to the above-described embodiment. FIG. 14 is a sectional view of the light-receiving part 3b shown in FIG. 13, illustrating a cross-section taken along the line IV—IV. With reference to FIGS. 13 and 14, the light-receiving part 3b according to the present modification includes an optical transmission medium, such as an optical fiber 15, a silicon bench 31, a lead frame 32, an APD 33, and a PIN-PD 34.

The silicon bench 31 functions as a mounting member on which the APD 33 and the PIN-PD 34 are mounted. The silicon bench 31 is placed on the lead frame 32. The silicon bench 31 is rectangular in plan view, and has an inclined surface 31a, a first surface 31b, and a second surface 31c. In the present modification, the first surface 31b functions as a principal plane on which the APD 33 and the PIN-PD 34 are mounted, and is positioned higher than the second surface 31c. The optical fiber 15 is placed on the second surface 31c. The inclined surface 31a is provided between the first surface 31b and the second surface 31c such that it adjoins the first surface 31b, and extends in a direction intersecting an optical axis A of signal light L1 emitted from an end 15a of the optical fiber 15 (in other words, an optical axis of the optical fiber 15). The inclined surface 31a functions as a reflective surface which reflects the signal light L1. In addition, a multilayer film for eliminating the polarization dependency is formed on the inclined surface 31a.

Wiring patterns 35a and 35b are provided on the first surface 31b of the silicon bench 31. The wiring patterns 35a and 35b are arranged adjacent to each other in a direction intersecting an optical axis A. The APD 33 is placed on the wiring pattern 35a such that the rear face of the APD 33 faces the first surface 31b of the silicon bench 31, and a part of the APD 33 projects above the inclined surface 31a. A cathodic electrode 33d of the APD 33 is electrically connected to the wiring pattern 35a with solder or the like. The PIN-PD 34 is placed on the wiring pattern 35b such that the rear face of the PIN-PD 34 faces the first surface 31b of the silicon bench 31, and a part of the PIN-PD 34 projects above the inclined surface 31a. A cathodic electrode (not shown) of the PIN-PD 34 is electrically connected to the wiring pattern 35b with solder or the like.

A light-receiving area 33b of the APD 33 is formed on a face of a semiconductor substrate 33a (first substrate) composed of a material which can transmit the signal light L1. A rear face of the semiconductor substrate 33a is optically coupled to the end 15a of the optical fiber 15 via the inclined surface 31a so that the signal light L1 reflected by the inclined surface 31a is received by the light-receiving area 33b. In the PIN-PD 34, similarly as in the APD 33, a light-receiving area 34b is formed on a face of a semiconductor substrate 34a (second substrate) composed of a material which can transmit the signal light L1. A rear face of the semiconductor substrate 34a is also optically coupled to the end 15a of the optical fiber 15 via the inclined surface 31a so that the signal light L1 reflected by the inclined surface 31a is received by the light-receiving area 34b.

An anodic electrode 33c is provided on the light-receiving area 33b of the APD 33, and the anodic electrode 33c is electrically connected to a lead pin 32e with a bonding wire 36a. In addition, an anodic electrode 34c is provided on the light-receiving area 34b of the PIN-PD 34, and the anodic electrode 34c is electrically connected to a lead pin 32b with a bonding wire 36d. The wiring pattern 35a is electrically connected to a lead pin 32f with a bonding wire 36b, and the wiring pattern 35b is electrically connected to a lead pin 32c with a bonding wire 36c.

The end 15a of the optical fiber 15, the APD 33, the PIN-PD 34, and the inclined surface 31a are covered with a transparent molded resin 38b, such as silicone resin, on the silicon bench 31. Accordingly, the optically coupled relationships among the end 15a of the optical fiber 15, the APD 33, the PIN-PD 34, and the inclined surface 31a are maintained. The molded portion including the optical fiber 15, the silicon bench 31, the lead frame 32, and the transparent resin 38b, is molded with sealing resin 38a, such as epoxy resin.

The light-receiving part may be structured in a manner similar to the light-receiving part according to the present modification, instead of the light-receiving part 3 according to the above-described embodiment or the light-receiving part 3a according to the first modification. In the light-receiving part 3b according to the present modification, a suitable structure can be made in which the APD 33 and the PIN-PD 34 are arranged side by side adjacently to each other such that the light-receiving area 33b receives a part of the signal light L1 emitted from the end 15a of the optical fiber 15 along the optical axis A and the light-receiving area 34b receives the other part of the signal light L1. In addition, the multilayer film for eliminating the polarization dependency can be easily formed on the silicon bench 31.

Ninth Modification

Figure 15:
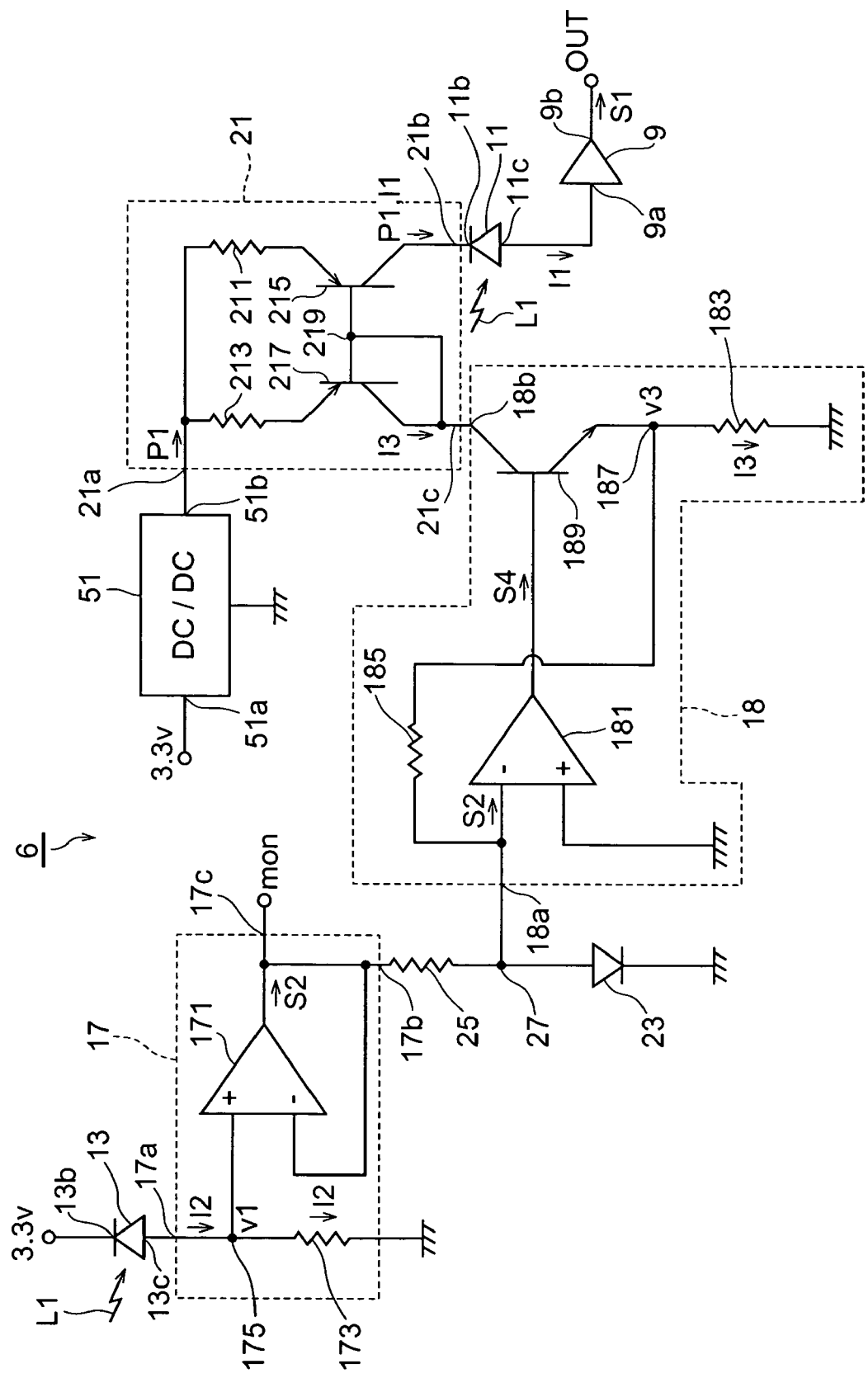
FIG. 15 is a circuit diagram showing an internal circuit of a control part of an optical receiver according to a ninth modification of the embodiment.

FIG. 15 is a circuit diagram showing an internal circuit of a control part 6 as a ninth modification of the optical receiver 1 according to the above-described embodiment. The structure of the control part 6 according to the present modification is similar to that of the control part 5 according to the above-described embodiment (see FIG. 6) except for the following points. That is, the control part 6 according to the present modification includes a current control circuit 18 and a DC-DC converter 51 in place of the voltage control circuit 19 and the DC-DC converter 7, respectively, of the above-described embodiment. In addition, different from the above-described embodiment, in the control part 6 according to the present modification, is that an output 21b (second output) of a current mirror circuit 21 is electrically connected to a cathodic electrode 11b of an APD 11 and an output 21c (first output) of the current mirror circuit 21 is electrically connected to the current control circuit 18.

The current control circuit 18 includes an OP amplifier 181, resistance elements 183 and 185, and an NPN transistor 189. In addition, the current control circuit 18 has inputs 18a and 18b. A negative input terminal of the OP amplifier 181 is electrically connected to a node 27 via the input 18a, and is also electrically connected to a node 187 via the resistance element 185. A positive input terminal of the OP amplifier 181 is electrically connected to a reference voltage wire. An output terminal of the OP amplifier 181 is electrically connected to the base terminal of the transistor 189. The collector terminal of the transistor 189 is electrically connected to the output 21c of the current mirror circuit 21 via the input 18b. The emitter terminal of the transistor 189 is electrically connected to a reference voltage wire via the node 187 and the resistance element 183.

The DC-DC converter 51 functions as a power supply circuit in the present modification and has an input 51a and an output 51b. The input 51a is electrically connected to a power-supply terminal of a predetermined voltage (for example, 3.3 V). The output 51b is electrically connected to an input 21a of the current mirror circuit 21. Different from the DC-DC converter 7 according to the above-described embodiment is that the DC-DC converter 51 converts the supply voltage obtained from the power-supply terminal into a predetermined supply voltage P1 (for example, 80V). Then, the DC-DC converter 51 supplies the supply voltage P1 to the current mirror circuit 21 from the output 51b.

Next, the operation of the present modification will be described below. In the following description, explanations similar to those of the optical receiver 1 according to the above-described embodiment are omitted.

When signal light L1 is incident on a PIN-PD 13, a voltage signal S2 is generated by a converting circuit 17 and is input to the current control circuit 18. The voltage signal S2 is input to the negative terminal of the OP amplifier 181. Then, the OP amplifier 181 generates a control signal S4. The control signal S4 is input to the base terminal of the transistor 189, and a current I3 corresponding to the control signal S4 flows between the collector terminal and the emitter terminal of the transistor 189. When the current I3 flows through the resistance element 183, a potential V3 is generated at the node 187 and the potential V3 is fed back to the negative input terminal of the OP amplifier 181 via the resistance element 185. Therefore, the voltage of the control signal S4 becomes equal to the product of the voltage of the voltage signal S2 and a predetermined factor, and the amount of current I3 is determined depending on the control signal S4.

The supply voltage P1 as a reverse bias voltage is applied, by the DC-DC converter 51 via the current mirror circuit 21, between the cathodic electrode 11b and the anodic electrode 11c of the APD 11. When signal light L1 is incident on the APD 11, an output current I1 flows in the APD 11. At this time, the current mirror circuit 21 operates such that the amount of output current I1 which flows through a resistance element 211 and a transistor 215 is substantially equal to the amount of current I3 which flows through a resistance element 213 and a transistor 217. More specifically, the amount of current I3 is controlled by the current control circuit 18 as described above, and the amount of output current I1 which flows into the APD 11 is substantially equal to the amount of current I3. An amplifier 9 generates a received signal S1 by converting the output current I1 into a voltage signal, and the received signal S1 is supplied to the outside of the optical receiver 1.

Due to the above-described operation, the output current I1 of the APD 11 is controlled, and the avalanche multiplication factor m of the APD 11 is maintained at the desired value. As in the above-described embodiment, also in the present modification, the current value of the output current I1 obtained by the APD 11 in the PIN mode when a predetermined quantity of light is incident (=Iava$_2$) and the current value of the output current I2 obtained by the PIN-PD 13 at that time (=Ipin$_2$) may be measured first, and thereafter the resistance of the resistance element 183 may be set on the basis of the product of the ratio of Iava$_2$ to Ipin$_2$ and the desired avalanche multiplication factor m (=m·(Iava$_2$/Ipin$_2$)).

In the present modification, the control part 6 controls the output current I1, which flows in the APD 11, on the basis of the current value of the output current I2 from the PIN-PD 13 such that the avalanche multiplication factor m of the APD 11 is maintained at a predetermined value. Thus, also when the optical receiver 1 includes the control part 6, the avalanche multiplication factor of the APD 11 can suitably be controlled.

The optical receiver according to the present invention is not limited to the above-described embodiment and modifications, and other various modifications are possible. For example, the planar shapes of the APD and the photodetector are not limited to those described in the above-described embodiment and modification, and the APD and the photodetector may also have various other shapes.

In the above-described embodiment, the control part controls the supply voltage applied to the APD, and in the ninth modification, the control part controls the amount of current which flows in the APD; however, the control part may control both the supply voltage and the current at the same time.

What is claimed is:

1. An optical receiver for receiving signal light, comprising:
    an avalanche photodiode including a first substrate and a light-receiving area provided on a face of the first substrate, the light-receiving area receiving a part of the signal light;
    a photodetector including a second substrate and a light-receiving area provided on a face of the second substrate, the light-receiving area receiving another part of the signal light; and
    a mounting member having a principal plane on which the avalanche photodiode and the photodetector are mounted,
    wherein the avalanche photodiode and the photodetector are arranged adjacent to each other on the mounting member such that a rear face of the first substrate and a rear face of the second substrate face the principal plane of the mounting member.

2. The optical receiver according to claim 1, wherein the photodetector is a PIN photodiode or a photoconductive element.

3. The optical receiver according to claim 1, wherein a side of the light-receiving area of the avalanche photodiode and a side of the light-receiving area of the photodetector extend along each other.

4. The optical receiver according to claim 1, wherein the photodetector is disposed in a form surrounding the avalanche photodiode.

5. The optical receiver according to claim 1, wherein a position corresponding to a peak in an quantity profile of the signal light is in the light-receiving area of the avalanche photodiode.

6. The optical receiver according to claim 1, wherein the mounting member has an inclined surface for reflecting the signal light, the inclined surface adjoining the principal plane of the mounting member and extending in a direction intersecting an optical axis of an optical transmission medium which propagates the signal light, wherein the avalanche photodiode and the photodetector are mounted on the principal plane such that the avalanche photodiode and the photodetector project above the inclined surface, wherein the first substrate and the second substrate are made of a material that can transmit the signal light, and wherein the rear face of the first substrate and the rear face of the second substrate are optically coupled to one end of the optical transmission medium via the reflective surface.

7. The optical receiver according to claim 6, further comprising a lead frame on which the mounting member is placed, wherein the mounting part and the lead frame are covered with a molded resin.

8. The optical receiver according to claims 1, further comprising a package for accommodating the avalanche photodiode and the photodetector, the package including a lens for converging the signal light so as to direct the signal light to the avalanche photodiode and the photodetector.

9. The optical receiver according to claim 1, further comprising a control means for controlling, on the basis of an output current value obtained from the photodetector, either one or both of a current flowing through the avalanche photodiode and a supply voltage applied to the avalanche photodiode, such that an avalanche multiplication factor of the avalanche photodiode is maintained at a predetermined value.

10. The optical receiver according to claim 9, wherein the control means controls either one or both of the supply voltage applied to the avalanche photodiode and the current flowing through the avalanche photodiode such that an average output current value obtained from the avalanche photodiode when the signal light is incident approaches $m \cdot Ipin1 \cdot (Iava_2/Ipin_2)$, where $Iava_2$ is an output current value of the avalanche photodiode in a PIN mode at a time when a predetermined quantity of light is incident and $Ipin_2$ is an output current value of the photodetector at that time, and m is a desired avalanche multiplication factor, and $Ipin1$ is the output current value of the photodetector.

11. The optical receiver according to one of claims 9 and 10, wherein the control means comprises:
    a converting circuit for converting the output current value obtained from the photodetector into a voltage signal;
    a current mirror circuit having an input, a first output, and a second output and being structured such that the amount of current at the second output is substantially equal to the amount of current at the first output, and the first output being connected to the avalanche photodiode;
    a power supply circuit for supplying the supply voltage to the input of the current mirror circuit; and
    a voltage control circuit for controlling the supply voltage on the basis of the voltage signal obtained from the converting circuit and the amount of current at the second output of the current mirror circuit.

12. The optical receiver according to one of claims 9 and 10, wherein the control means comprises:
    a converting circuit for converting the output current value obtained from the photodetector into a voltage signal;
    a current mirror circuit having an input, a first output, and a second output and being structured such that the amount of current at the second output is substantially equal to the amount of current at the first output, and the second output being connected to the avalanche photodiode;
    a power supply circuit for supplying the supply voltage to the input of the current mirror circuit; and
    a current control circuit for controlling the amount of current at the first output of the current mirror circuit on the basis of the voltage signal obtained from the converting circuit.

* * * * *